(12) United States Patent
Seo et al.

(10) Patent No.: US 12,014,687 B2
(45) Date of Patent: Jun. 18, 2024

(54) GATE DRIVING CIRCUIT AND DISPLAY DEVICE COMPRISING THE SAME

(71) Applicant: LG Display Co., Ltd., Seoul (KR)

(72) Inventors: Daeyoung Seo, Paju-si (KR); YoungIn Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/978,005

(22) Filed: Oct. 31, 2022

(65) Prior Publication Data

US 2023/0186825 A1 Jun. 15, 2023

(30) Foreign Application Priority Data

Dec. 9, 2021 (KR) .......................... 10-2021-0175873

(51) Int. Cl.
*G09G 3/3266* (2016.01)
*G09G 3/20* (2006.01)
*G11C 19/28* (2006.01)

(52) U.S. Cl.
CPC ......... *G09G 3/3266* (2013.01); *G09G 3/2092* (2013.01); *G11C 19/28* (2013.01); *G09G 2300/0852* (2013.01); *G09G 2310/0267* (2013.01); *G09G 2310/0275* (2013.01); *G09G 2310/0291* (2013.01); *G09G 2310/08* (2013.01)

(58) Field of Classification Search
CPC .. G09G 3/3266; G09G 3/2092; G09G 3/3674; G09G 3/3677; G09G 2310/0286; G11C 19/28
See application file for complete search history.

(56) References Cited

U.S. PATENT DOCUMENTS

| 2019/0043405 | A1* | 2/2019 | Noh | G09G 3/3674 |
| 2019/0108809 | A1* | 4/2019 | Zheng | G09G 3/20 |
| 2019/0164478 | A1* | 5/2019 | Kim | H10K 59/131 |
| 2021/0125564 | A1* | 4/2021 | Yuan | G11C 19/28 |
| 2022/0343858 | A1* | 10/2022 | Feng | G09G 3/3266 |

FOREIGN PATENT DOCUMENTS

| KR | 20200014555 A | 2/2020 |
| KR | 20200034478 A | 3/2020 |

* cited by examiner

*Primary Examiner* — Xuemei Zheng
(74) *Attorney, Agent, or Firm* — Seed IP Law Group LLP

(57) ABSTRACT

Disclosed is a gate driving circuit comprising a plurality of stage circuits dependently connected to each other and configured to output 'j' output signals ('j' is an integer of 2 or more), wherein each of the plurality of stage circuits includes a logic controller for controlling a voltage of each of first and second nodes, and an output circuit unit for outputting each of 'j' clock signals as the 'j' output signal in response to the voltage of the first node, wherein the output circuit unit includes 'j' output buffers for outputting each of the 'j' clock signals as the 'j' output signal through an output node in response to the voltage of the first node, and a capacitor prepared between the first node and the output node of some of the 'j' output buffers.

20 Claims, 10 Drawing Sheets

GATE DRIVING CIRCUIT AND DISPLAY DEVICE COMPRISING THE SAME

BACKGROUND

Technical Field

The present disclosure relates to a gate driving circuit and a display device comprising the same.

Description of the Related Art

As an information technology develops, a market of a display device corresponding to a connection medium between a user and information is increased. Various forms of communication are active beyond an information delivery of text between users. As the type of information changes, the performance of the display device is also developed. Accordingly, the use of various types of display devices such as an organic light emitting display (OLED), a liquid crystal display (LCD), a micro light emitting diode (micro LED) display, and a quantum dot display (QD) may be increased.

The display devices include a display panel including a plurality of pixels having thin film transistors connected with a plurality of gate lines and a plurality of data lines, a data driving circuit for supplying a data voltage to the data line, and a gate driving circuit including a shift register having a plurality of stages for supplying a gate signal to the gate line.

The gate driving circuit may be simultaneously formed on a non-display area of the display panel in the process of manufacturing the data line and the gate line of the display panel and the thin film transistor of each pixel. That is, a gate-in-panel (GIP) method for directly integrating the gate driving circuit into the display panel is applied.

BRIEF SUMMARY

In order to realize a narrow bezel, the inventors made various experiments for a gate driving circuit with a new structure capable of driving a plurality of gate lines with a single stage implemented thereinto so as to reduce a bezel width, and a display device comprising the same. According to various experimental processes, when one stage sequentially outputs a plurality of scan signals, an output deviation of each scan signal occurs. Thus, according to various experimental results, the present disclosure relates to a gate driving circuit having a new structure capable of reducing an output deviation of a plurality of scan signals output from one stage, and a display device comprising the same.

The present disclosure has been made in view of the above problems, and it is a technical benefit of the present disclosure to provide a gate driving circuit capable of reducing an output deviation of a plurality of scan signals output from one stage, and reducing the size thereof, and a display device comprising the same.

In accordance with an aspect of the present disclosure, the above and other technical benefits can be accomplished by the provision of a gate driving circuit comprising a plurality of stage circuits dependently connected to each other and configured to output 'j' output signals ('j' is an integer greater than or equal to 2), wherein each of the plurality of stage circuits includes a logic controller for controlling a first voltage of a first node and a second voltage of a second node, and an output circuit for outputting each of 'j' clock signals as the 'j' output signal in response to the voltage of the first node, wherein the output circuit includes 'j' output buffers for outputting each of the 'j' clock signals as a respective output signal of the 'j' output signals through an output node in response to the first voltage of the first node, and a plurality of capacitors disposed between the first node and the output node of some of the 'j' output buffers.

In accordance with another aspect of the present disclosure, there is provided a display device comprising a display panel including a plurality of data lines, a plurality of gate lines crossing the plurality of data lines, and a plurality of subpixels connected to adjacent pairs of the data and gate lines, a gate driving circuit including a plurality of stage circuits for outputting scan signals by groups of 'j' gate lines among the plurality of gate lines based on a predetermined or selected order, a data driving circuit connected to each of the plurality of data lines, and a timing controller for controlling the driving timing of each of the gate driving circuit and the data driving circuit, wherein the gate driving circuit includes a gate driver comprising a plurality of stage circuits dependently connected to each other and configured to output 'j' output signals (T is an integer of 2 or more), wherein each of the plurality of stage circuits includes a logic controller for controlling a voltage of each of first and second nodes, and an output circuit for outputting each of T clock signals as the 'j' output signal in response to the voltage of the first node, wherein the output circuit includes 'j' output buffers for outputting each of the T clock signals as a respective output signal of the 'j' output signals through a respective output node in response to the voltage of the first node, and a capacitor disposed between the first node and the output node of some of the 'j' output buffers.

BRIEF DESCRIPTION OF THE SEVERAL VIEWS OF THE DRAWINGS

The above and other technical benefits, features and other advantages of the present disclosure will be more clearly understood from the following detailed description taken in conjunction with the accompanying drawings, in which.

DETAILED DESCRIPTION

Figure 1:
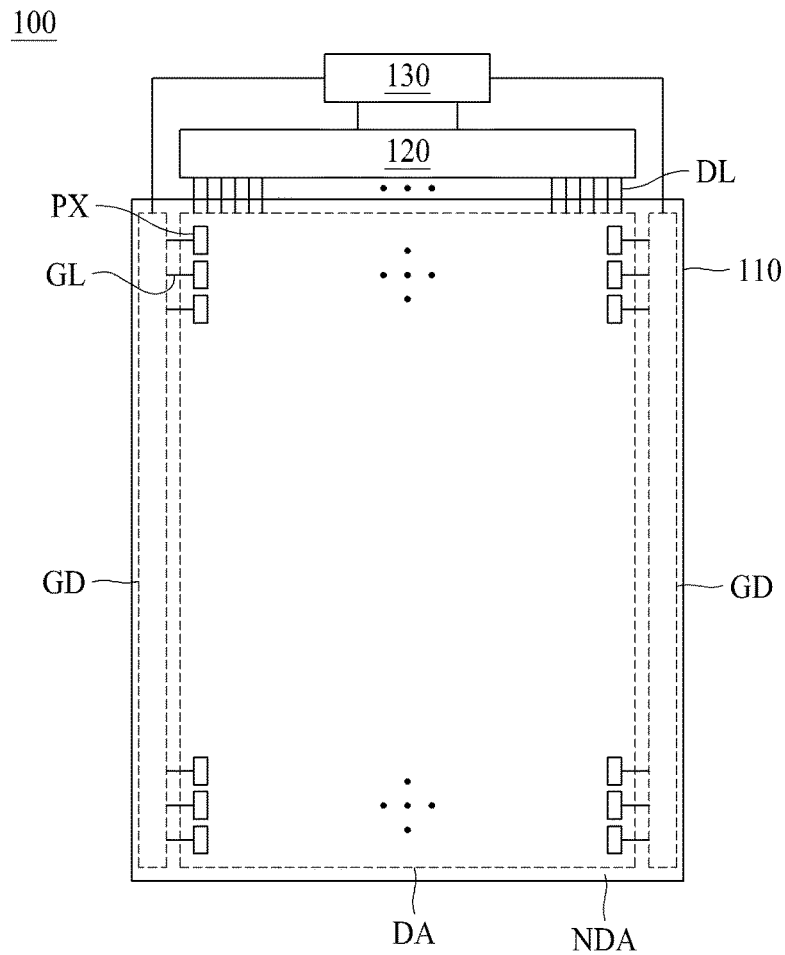
FIG. 1 is a block diagram of a display device according to various embodiments of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to partition one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the present disclosure, a pixel circuit and a gate driving circuit formed on a substrate of a display panel may be implemented with an N-type or P-type transistor. For example, a transistor may be implemented as a thin film transistor having an N-type or P-type metal oxide semiconductor field effect transistor MOSFET transistor structure. The thin film transistor is a 3-electrode device including a gate, a source, and a drain. In the thin film transistor, a carrier may flow from the source to the drain. In case of the N-type thin film transistor, since the carrier is an electron, a source voltage is relatively lower than a drain voltage so that the electron may flow from the source to the drain. In the N-type thin film transistor, the electron flows from the source to the drain, whereby a current direction flows from the drain to the source. In case of the P-type thin film transistor, since the carrier is a hole, a source voltage is relatively higher than a drain voltage so that the hole flows from the source to the drain. In the P-type thin film transistor, the hole flows from the source to the drain, whereby a current direction flows from the source to the drain. In the thin film transistor of the MOSFET transistor structure, the source and the drain are not fixed, but changed according to the applied voltage. Accordingly, in the description of the present disclosure, any one of the source and the drain will be described as a first source/drain electrode, and the remaining will be described as a second source/drain electrode.

Hereinafter, a preferred embodiment of a gate driving circuit and a display device comprising the same according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a block diagram of a display device according to various embodiments of the present disclosure.

Referring to FIG. 1, a display device 100 according to various embodiments of the present disclosure may include a display panel 110 having a plurality of data lines DL and a plurality of gate lines GL and a plurality of pixels PX connected to the plurality of data lines DL and the plurality of gate lines GL, and driving circuits for providing a driving signal to the display panel 110.

In the drawings, the plurality of pixels PX are arranged in a matrix form and are configured to constitute a pixel array. However, it is not limited to thereto. The plurality of pixels PX may be arranged in various forms without being limited thereto.

The driving circuit may include a data driving circuit 120 for providing the data signal to the plurality of data lines DL, a gate driving circuit GD for providing a gate signal to the plurality of gate lines GL, and a timing controller 130 for controlling the data driving circuit 120 and the gate driving circuit GD.

The display panel 110 may include a display area DA in which an image is displayed, and a non-display area NDA disposed in the periphery of the display area DA. In the display area DA, there are the plurality of pixels PX, the data line DL for providing the data signal to the plurality of pixels PX, and the gate line GL for providing the gate signal to the plurality of pixels PX.

The plurality of gate lines GL disposed in the display area DA may extend to the non-display area NDA, and may be electrically connected to the gate driving circuit GD. The gate line GL electrically connects the plurality of pixels PX disposed in a first direction (or a horizontal direction) with the gate driving circuit GD. Additionally, in the non-display area, wirings related with the gate driving may be disposed to drive the plurality of pixels PX or to generate various gate signals for the gate driving circuit GD. For example, the wirings related with the gate driving may include one or more high level gate voltage lines for supplying a high level gate voltage to the gate driving circuit GD, one or more low level gate voltage lines for supplying a low level gate voltage to the gate driving circuit GD, a plurality of clock lines for supplying a plurality of clock signals to the gate driving circuit GD, and one or more start lines for supplying the one or more start signals to the gate driving circuit GD.

The plurality of data lines DL disposed in the display area DA may extend to the non-display area NDA and may be electrically connected to the data driving circuit 120. The data line DL electrically connects the plurality of pixels PX disposed in a second direction (or a vertical direction) crossing the first direction with the data driving circuit 120, or may be implemented as a single wire, or may be implemented by connecting a plurality of wires through a contact hole using a link line.

In the display panel 110, the plurality of data lines DL and the plurality of gate lines GL are disposed together with the pixel array. As described above, the plurality of data lines DL and the plurality of gate lines GL may be horizontally or vertically disposed. For convenience of explanation, it is assumed that the plurality of data lines DL are vertically arranged, and the plurality of gate lines GL are horizontally arranged, but not limited to this structure.

The timing controller 130 starts scanning the data signal according to the timing implemented in each frame, converts an input image data inputted from the outside according to a data signal format used in the data driving circuit 120, outputs the converted image data, and controls the data driving circuit 120 at an appropriate time according to the scanning.

The timing controller 130 receives timing signals including a vertical synchronization signal, a horizontal synchronization signal, an input data enable signal, and a clock signal together with the input image data from the outside. The timing controller 130, which receives the timing signals, generates and outputs control signals for controlling the data driving circuit 120 and the gate driving circuit GD.

For example, the timing controller 130 outputs various data control signals including a source start pulse, a source sampling clock, and a source output enable signal to control the data driving circuit 120. The source start pulse controls the data sampling start timing of one or more data signal generation circuits constituting the data driving circuit 120. The source sampling clock is a clock signal for controlling the sampling timing of data in each of the data signal generation circuits. The source output enable signal controls the output timing of the data driving circuit 120.

Also, the timing controller 130 outputs a gate control signal including a gate start pulse, a gate shift clock, a gate output enable signal, and the like to control the gate driving circuit GD. The gate start pulse controls the operation start timing of one or more gate signal generation circuits constituting the gate driving circuit GD. The gate shift clock is a clock signal commonly input to one or more gate signal generation circuits, and controls the shift timing of the scan signal. The gate output enable signal specifies timing information of one or more gate signal generation circuits.

The timing controller 130 may be a timing controller used in the conventional display device or a control device capable of further performing other control functions including a timing controller.

The timing controller 130 may be implemented as a separate component from the data driving circuit 120 and may be integrated with the data driving circuit 120 to be implemented as one integrated circuit.

The data driving circuit 120 may include one or more data signal generation circuits. The data signal generation circuit may include a shift register, a latch circuit, a digital-to-analog converter, an output buffer, and the like. The data signal generation circuit may further include an analog-to-digital converter.

The data signal generating circuit may be connected to a bonding pad of the display panel 110 by a tape automated bonding TAB method, a chip on glass COG method, or a chip on panel COP method, may be directly disposed on the display panel 110, or may be integrated into the display panel 110. In addition, the plurality of data signal generation circuits may be implemented in a chip on film COF method mounted on a source-circuit film connected to the display panel 110.

The gate driving circuit GD sequentially supplies the gate signal to the plurality of gate lines GL, thereby driving the plurality of pixels PX connected to the plurality of gate lines GL. The gate driving circuit GD may include a shift register, a level shifter, and the like.

The gate driving circuit GD may be connected to the bonding pad of the display panel 110 by a tape automated bonding TAB method, a chip on glass COG method, or a chip on panel COP method, or may be implemented in a gate in panel GIP method and disposed directly on the display panel 110. Also, the plurality of gate signal generation circuits may be mounted on a gate-circuit film connected to the display panel 110 and may be implemented in a chip on film COF method. The gate driving circuit GD includes the plurality of gate signal generation circuits, and the plurality of gate signal generation circuits may be implemented in a GIP type and may be disposed in the non-display area NDA of the display panel 110.

The gate driving circuit GD sequentially supplies the gate signal of a gate high voltage VGH having a first voltage level for turning on or off the transistor or the gate signal of a gate low voltage VGL having a second voltage level for turning on or off the transistor according to the control of the timing controller 130. When the signal is provided to a specific gate line by the gate driving circuit GD, the data driving circuit 120 converts the image data received from the timing controller 130 into an analog data signal and supplies the analog data signal to the plurality of data lines DL.

The data driving circuit 120 may be disposed on one side of the display panel 110. For example, the gate driving circuit 120 may be disposed on the upper, lower, left, or right sides of the display panel 110. In addition, the data driving circuit 120 may be disposed on both sides of the display panel 110 according to a driving method, a panel design method, or the like. For example, the data driving circuit 120 may be disposed on the upper and lower sides or left and right sides of the display panel 110.

The gate driving circuit GD may be disposed on one side of the display panel 110. For example, the gate driving circuit GD may be disposed on the upper, lower, left, or right sides of the display panel 110. In addition, the gate driving circuit GD may be disposed on both sides of the display panel 110 according to a driving method, a panel design method, or the like. For example, the gate driving circuit GD may be disposed on the upper and lower sides or left and right sides of the display panel 110. The gate driving circuit GD may be formed in the left and/or right non-display area NDA of the substrate together with the process of manufacturing the thin film transistor of the pixel PX, and may operate according to a single feeding method to supply the gate signal to each of the plurality of gate lines GL. Alternatively, the gate driving circuit GD may be formed on the left and right non-display areas NDA of the substrate, and may operate according to a double feeding method to supply the gate signal to each of the plurality of gate lines GL. Alternatively, the gate driving circuit GD may be formed in the left and right non-display areas NDA of the substrate, and may operate in accordance with an interlacing method of the double feeding method to supply the gate signal to each of the plurality of gate lines GL.

The gate driving circuit GD may include a plurality of stage circuits which are dependently connected to each other to sequentially supply the gate signal to each of the plurality of gate lines GL.

Figure 2:
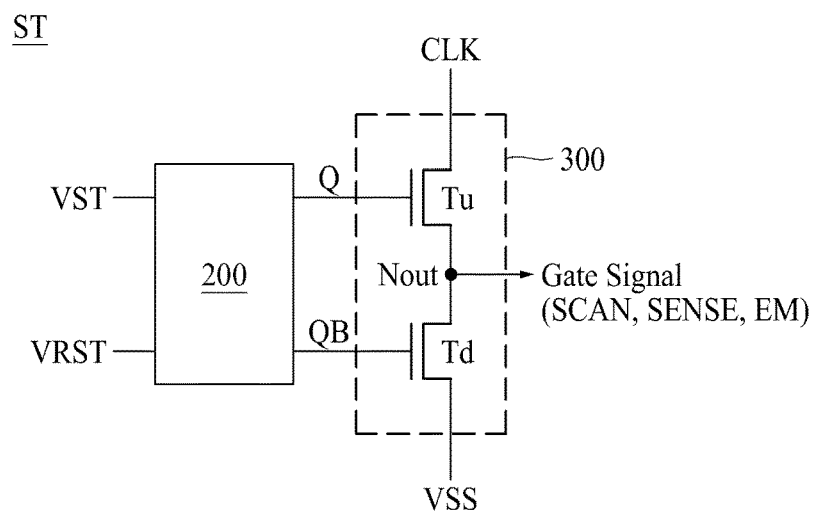
FIG. 2 schematically illustrates the stage circuit constituting the gate driving circuit according to various embodiments of the present disclosure.

FIG. 2 schematically illustrates the stage circuit of the gate driving circuit according to various embodiments of the present disclosure.

Referring to FIG. 2, the gate driving circuit GD may include the plurality of stage circuits ST to drive the plurality of gate lines GL.

Each of the plurality of stage circuits ST may include at least one logic controller 200 and at least one output circuit unit 300. The output circuit unit 300 may be an output circuit 300, and may be referred to as the output circuit 300.

Each output circuit unit 300 may include a pull-up transistor Tu and a pull-down transistor Td in which a turn-on operation is alternated. The pull-up transistor Tu and the pull-down transistor Td may be represented as an output buffer that outputs an output signal.

A clock signal CLK is applied to a drain node (or source node) of the pull-up transistor Tu, a source node (or a drain node) of the pull-up transistor Tu is electrically connected to an output node Nout, and a gate node of the pull-up transistor Tu may be a first node Q controlled by the logic controller 200.

A gate low potential voltage VSS (e.g., a low potential voltage, a gate low voltage, etc.) is applied to a drain node (or source node) of the pull-down transistor Td, a source node (or a drain node) of the pull-down transistor Td is electrically connected to the output node Nout, and a gate node of the pull-down transistor Td may be a second node QB controlled by the logic controller 200.

The first node Q and the second node QB may have opposite voltage states to each other. For example, if the first node Q is at a high voltage level, the second node QB may be a low voltage level. If the first node Q is at a low voltage level, the second node QB may be a high voltage level.

When the pull-up transistor Tu is turned on according to the high voltage level (or low voltage level) of the first node Q, the pull-down transistor Td is turned off according to the low voltage level (or high voltage level) of the second node QB. When the pull-up transistor Tu is turned off according to the low voltage level (or high voltage level) of the first node Q, the pull-down transistor Td is turned on according to the high voltage level (or low voltage level) of the second node QB.

The output node Nout may be electrically connected to one of a scan control line, a sense control line, and an emission control line among the plurality of gate lines GL.

When the pull-up transistor Tu is turned on, the clock signal CLK applied to the pull-up transistor Tu is output as an output signal through the output node Nout. The output signal output to the output node Nout may be one of a scan signal, a sense signal, and an emission signal EM having a turn-on voltage level (or first voltage level).

When the pull-down transistor Td is in a turn-on state, the gate low potential voltage VSS (e.g. low potential voltage, gate low voltage, etc.) applied to the pull-down transistor Td is output as an output signal through the output node Nout. The output signal output to the output node Nout may be one of a scan signal, a sense signal, and an emission signal EM having a turn-off voltage level (or second voltage level).

The logic controller 200 is a circuit for controlling the voltage of each of the first node Q and the second node QB, and may include two or more transistors (switching elements). The logic controller 200 may receive a set signal VST and set the operation of the corresponding stage circuit ST, and may receive a reset signal VRST and reset the operation of the corresponding stage circuit ST. The logic controller 200 may receive a separate voltage to control the voltage of each of the first node Q and the second node QB.

However, if each stage circuit ST is connected to one of the scan control line, the sense control line, and the emission control line among the plurality of gate lines GL by an one-to-one correspondence, it is difficult to satisfy a new design requiring high resolution and narrow bezel.

The inventors of the present disclosure propose a gate driving circuit capable of outputting 'j' ('j' is an integer of 2 or more) output signals, and a display device comprising the same.

Figure 3:
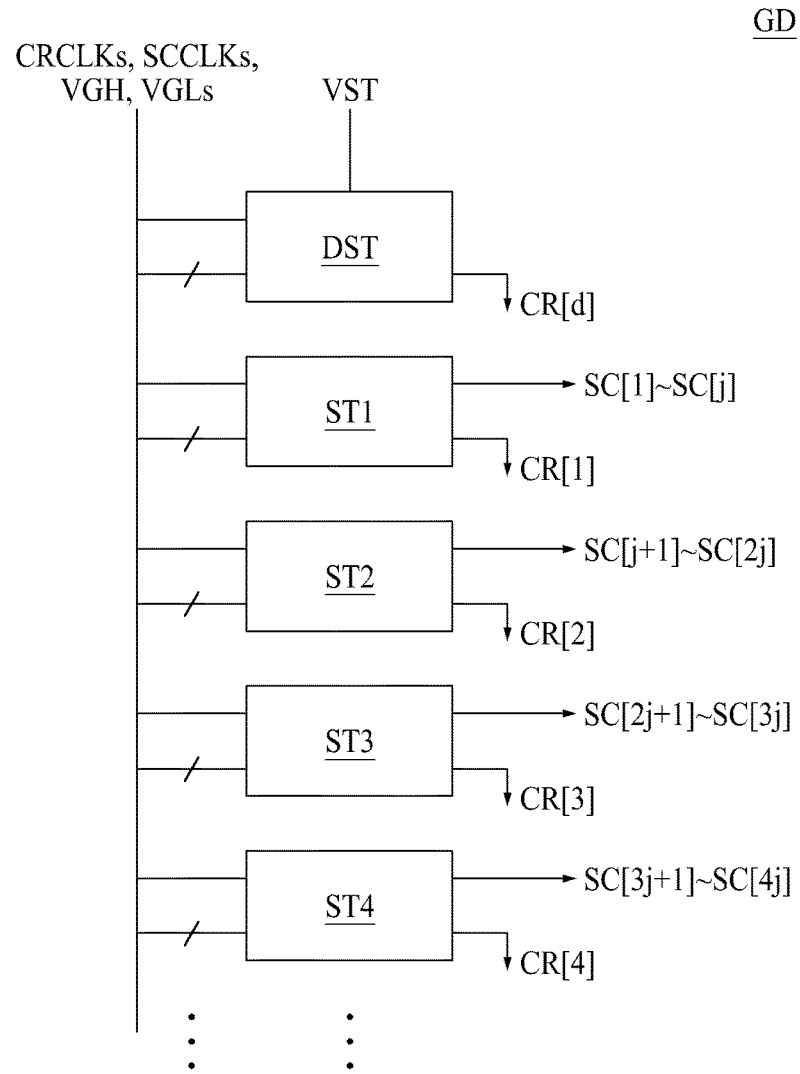
FIG. 3 illustrates a gate driving circuit according to various embodiments of the present disclosure.
Figure 4:
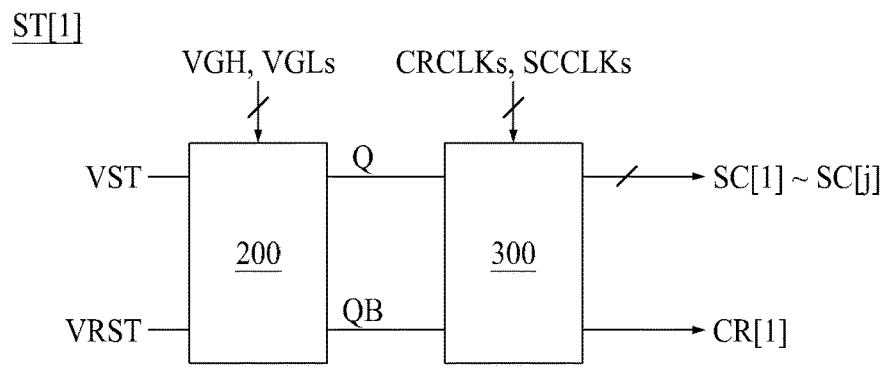
FIG. 4 illustrates a stage circuit of the gate driving circuit according to various embodiments of the present disclosure.

FIG. 3 illustrates a gate driving circuit according to various embodiments of the present disclosure, and FIG. 4 illustrates a stage circuit of the gate driving circuit according to various embodiments of the present disclosure.

Referring to FIG. 3, the gate driving circuit GD according to various embodiments of the present disclosure may include a plurality of stage circuits ST1, ST2, ST3, and ST4 which are dependently connected to each other. The gate driving circuit GD may further include a dummy stage circuit DST disposed at a front end of the first stage circuit ST1. Further, the dummy stage circuit DST may be disposed at the end of the plurality of stage circuits ST1, ST2, ST3, and ST4. It should be understood that circuits being "dependently connected to each other" includes the meaning that operation of some or all of the circuits is dependent on one or more outputs from another of the circuits. For example, the plurality of stage circuits ST1, ST2, ST3, ST4 may be electrically connected to each other in a daisy chain, where an operation of the stage circuit ST4 is triggered by an output of the stage circuit ST3, which is triggered by an output of the stage circuit ST2, which is triggered by an output of the stage circuit ST1.

A plurality of clock signals CRCLKs and SCCLKs, a gate high voltage VGH (or gate high potential voltage, high potential voltage, and etc.), a plurality of gate low voltages VGLs (or gate low potential voltage, low potential voltage, and etc.) and a gate start signal VST (or set signal) may be applied to the gate driving circuit GD from a timing controller 130.

The plurality of clock signals CRCLKs and SCCLKs may include a scan clock signal SCCLKs and a carry clock signal CRCLKs.

Each of the plurality of stage circuits ST1, ST2, ST3, and ST4 may output T (T is an integer of 2 or more) output signals. Each of the stage circuits ST1, ST2, ST3, and ST4 may be connected to T gate lines GL, and may sequentially output T output signals to each of the T gate lines GL according to the clock signals CRCLKs and SCCLKs applied from the timing controller 130. For example, the plurality of scan clock signals SCCLKs may be sequentially applied to each of the stage circuits ST1, ST2, ST3, and ST4, and each of the stage circuits ST1, ST2, ST3, and ST4 may sequentially output each of the plurality of scan clock signals SCCLKs as T scan signals SC. Also, each stage circuit ST1, ST2, ST3, and ST4 may receive one carry clock signal CRCLK and output the carry clock signal CRCLK as the carry signal CR. The T scan signals SC output from each of the stage circuits ST1, ST2, ST3, and ST4 are provided to sequentially drive the corresponding gate lines GL. The carry signal CR output from each of the stage circuits ST1, ST2, ST3, and ST4 may be supplied as the previous carry signal (or gate start signal, set signal) to any one among the next stage circuits, or may be supplied as the next carry signal (or reset signal) to any one among the previous stage circuits.

The gate driving circuit GD may receive the gate start signal VST supplied from the timing controller 130. For example, the gate start signal VST may be applied to the dummy stage circuit DST.

The gate start signal VST is a signal for controlling a start time point in each of an image display section and a black display section for each frame, and may be generated immediately before the start time point of each of the image display section and the black display section. For example, the gate start signal VST may be generated twice per frame.

The gate driving circuit GD may receive the plurality of clock signals CRCLKs and SCCLKs supplied from the timing controller 130. The plurality of clock signals CRCLKs and SCCLKs may include the scan clock signal SCCLKs and the carry clock signal CRCLKs. For example, the carry clock signal CRCLKs may be a 3-phase clock signal shifted by a predetermined or selected period, and the scan clock signal SCCLKs may be a 12-phase clock signal shifted by a predetermined or selected period, but is not limited thereto.

The gate driving circuit GD may receive gate driving voltages VGH and VGLs having different voltage levels from a power supply (not shown). The gate driving voltage VGH and VGLs may include the gate high voltage VGH (or gate high potential voltage, high potential voltage, etc.) and the plurality of gate low voltages VGLs (or gate low potential voltage, low potential voltage, etc.).

The dummy stage circuit DST may be disposed at the front end of the first stage circuit ST1. The dummy stage circuit DST may generate a dummy carry signal CR[d] in response to the gate start signal VST supplied from the timing controller 130, and may supply the dummy carry signal CR[d] as the previous carry signal or gate start signal to any one among the stage circuits ST1, ST2, ST3, and ST4. Also, the dummy stage circuit DST is disposed at the end of the stage circuits ST1, ST2, ST3, and ST4. The dummy stage circuit DST may generate a dummy carry signal CR[d] and may supply the dummy carry signal CR[d] as the next carry signal (or reset signal) to any one among the stage circuits ST1, ST2, ST3, and ST4.

The plurality of stage circuits ST1, ST2, ST3, and ST4 may be dependently connected to each other. Each of the plurality of stage circuits ST1, ST2, ST3, and ST4 may sequentially generate T (T is an integer of 2 or more) scan signals SC[1]~SC[j], SC[j+1]~SC[2j], SC[2j+1]≠SC[3j], and SC[3j+1]≠SC[4j], and may supply the scan signals to the corresponding gate line GL disposed on the display panel 110. Also, each of the plurality of stage circuits ST1, ST2, ST3, and ST4 may generate the carry signal CR[1], CR[2], CR[3], and CR[4] and may supply the generated carry signal as the previous carry signal (or gate start signal, set signal) to any one of the next stage circuits, or may supply the generated carry signal as the next carry signal (or reset signal) to any one of the previous stage circuits.

Referring to FIG. 4, the stage circuit ST[1] may include a logic controller 200 and an output circuit unit 300.

The logic controller 200 is a circuit for controlling the voltage in each of the first node Q and the second node QB, and may include two or more transistors (switching elements). The logic controller 200 receives the set signal VST and sets the operation of the corresponding stage circuit ST[1], and receives the reset signal VRST and resets the operation of the corresponding stage circuit ST[1]. The set signal VST may be the previous carry signal output from the previous stage circuit, and the reset signal VRST may be the next carry signal output from the next stage circuit.

The output circuit unit 300 may output the output signal according to the voltage of the first node Q or the second node QB controlled by the logic controller 200. The output circuit unit 300 may receive the T scan clock signals SCCLKs among the plurality of scan clock signals SCCLKs, and one carry clock signal CRCLK among the plurality of carry clock signals CRCLKs, and may output the T scan signals SC[1]~SC[j] and one carry signal CR[1] according to the voltage of the first node Q or the second node QB controlled by the logic controller 200.

Figure 5:
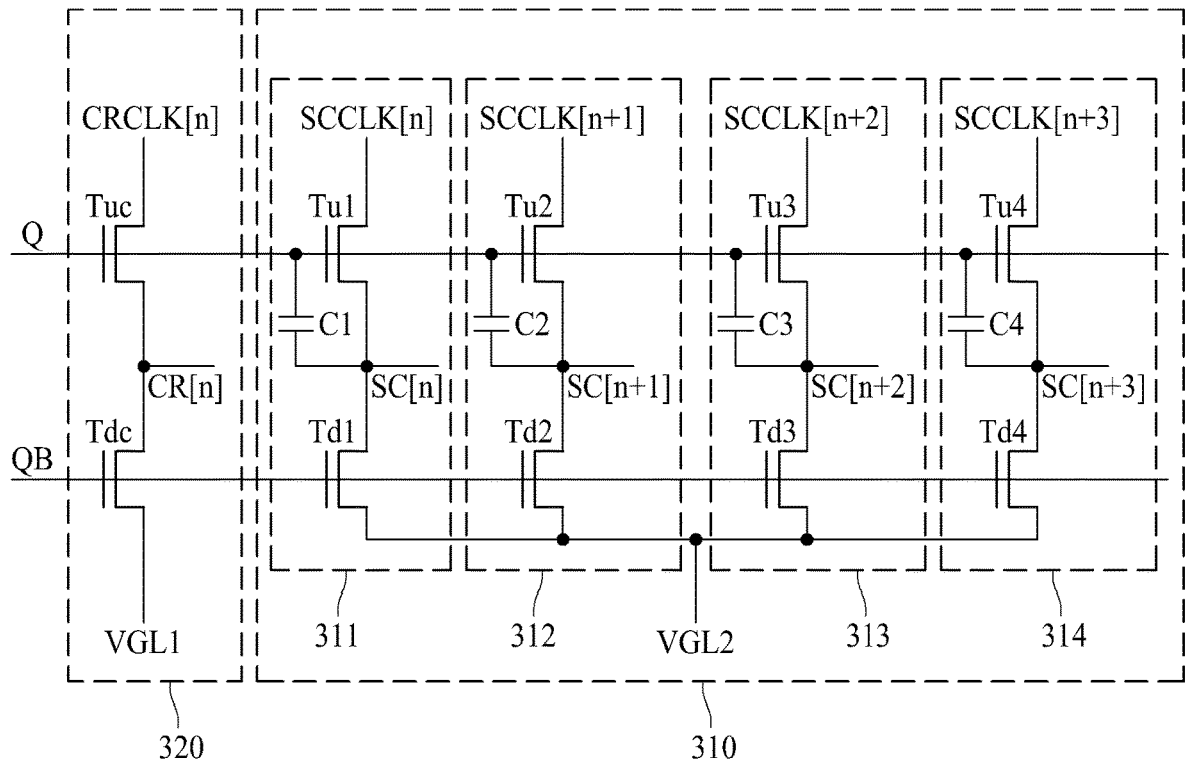
FIG. 5 is a circuit diagram of the output circuit unit according to one embodiment of the present disclosure.
Figure 6:
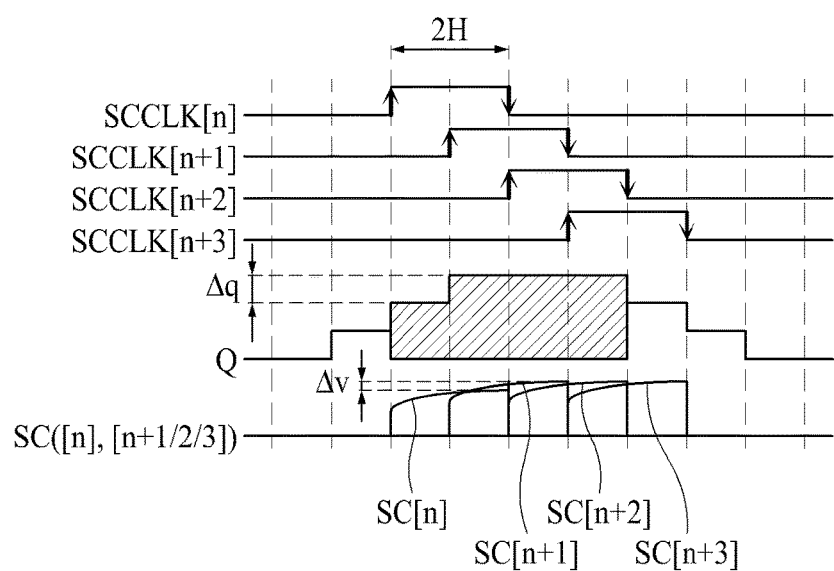
FIG. 6 is a waveform diagram illustrating the scan clock signal applied to the output circuit unit shown in FIG. 5, the scan signal output from the output circuit unit, and a voltage waveform of the first node.

FIG. 5 is a circuit diagram of the output circuit unit according to one embodiment of the present disclosure, and FIG. 6 is a waveform diagram illustrating the scan clock signal applied to the output circuit unit shown in FIG. 5, the scan signal output from the output circuit unit, and a voltage waveform of the first node.

Referring to FIG. 5, the output circuit unit 300 according to one embodiment of the present disclosure may include a scan output circuit unit 310 and a carry output circuit unit 320. The scan output circuit unit 310 and the carry output circuit unit 320 may be a scan output circuit 310 and a carry output circuit 320, respectively, and may be referred to as the scan output circuit 310 and the carry output circuit 320.

The carry output circuit unit 320 may output the carry clock signal CRCLK[n] as the carry signal CR[n] according to the voltage level of the first node Q or the second node QB. The carry output circuit unit 320 may include a carry signal output buffer including a carry pull-up transistor Tuc and a carry pull-down transistor Tdc. The carry output circuit unit 320 may be a single carry signal output buffer for outputting one carry clock signal CRCLK[n] among the plurality of carry clock signals CRCLKs as the carry signal CR[n].

The carry pull-up transistor Tuc and the carry pull-down transistor Tdc may be connected in series between a terminal to which the carry clock signal CRCLK[n] is applied and a terminal to which the first gate low voltage VGL1 is applied, and the carry pull-up transistor Tuc may output the carry signal CR[n] through a carry output node connected between the carry pull-up transistor Tuc and the carry pull-down transistor Tdc.

The carry pull-up transistor Tuc may output the carry signal CR[n] having a first voltage level corresponding to the carry clock signal CRCLK[n] in response to the voltage of the first node Q. The carry signal CR[n] may be supplied to any one of the next stage circuits as the previous carry signal (or gate start signal, set signal, etc.). For example, the carry pull-up transistor Tuc may include a gate electrode connected to the first node Q, a first source/drain electrode connected to the carry output node, and a second source/drain electrode connected to the terminal to which the carry clock signal CRCLK[n] is applied.

The carry pull-down transistor Tdc may output the carry signal CR[n] having a second voltage level corresponding to the first gate low voltage VGL1 (or gate low potential voltage, low potential voltage, etc.) according to the voltage of the second node QB. The carry signal CR[n] may be supplied to any one of the next stage circuits as the next carry signal (or reset signal). For example, the carry pull-down transistor Tdc may include a gate electrode connected to the second node QB, a first source/drain electrode connected to the carry output node, and a second source/drain electrode connected to the terminal to which the first gate low voltage VGL1 is applied.

The scan output circuit unit 310 may output the 'j' scan signals SC[n] to SC[n+3] according to a predetermined or selected order of each of the 'j' scan clock signals SCCLK[n] to SCCLK[n+3] ('j' is an integer of 2 or more) according to the voltage level of the first node Q or the second node QB.

As shown in FIG. 5, when 'j' is 4, the scan output circuit unit 310 may include first, second, third and fourth scan signal output buffers 311, 312, 313, and 314 for outputting the four scan clock signals of the (n)th scan clock signal SCCLK[n] to the (n+3)th scan clock signal SCCLK[n+3] among the plurality of scan clock signals SCCLKs as the (n)th scan signal SC[n] to the (n+3)th scan signal SC[n+3], respectively.

The first scan signal output buffer 311 may include a first scan pull-up transistor Tu1, a first scan pull-down transistor Td1, and a first capacitor C1. The second scan signal output buffer 312 may include a second scan pull-up transistor Tu2, a second scan pull-down transistor Td2, and a second capacitor C2. The third scan signal output buffer 313 may include a third scan pull-up transistor Tu3, a third scan pull-down transistor Td3, and a third capacitor C3. The fourth scan signal output buffer 314 may include a fourth scan pull-up transistor Tu4, a fourth scan pull-down transistor Td4, and a fourth capacitor C4.

Each of the first to fourth scan pull-up transistors Tu1, Tu2, Tu3, and Tu4 and each of the first to fourth scan pull-down transistors Td1, Td2, Td3, and Td4 may be connected in series between a terminal to which the respective scan clock signals SCCLK[n] to SCCLK[N+3] are applied, and a terminal to which the second gate low voltage VGL2 is applied in common. Each of the first to fourth capacitors C1, C2, C3, and C4 may be connected between the gate electrode of the respective first to fourth scan pull-up transistor Tu1, Tu2, Tu3, and Tu4 and a respective scan output node between the respective first to fourth scan pull-up transistor Tu1, Tu2, Tu3, and Tu4 and the respective first to fourth scan pull-down transistor Td1, Td2, Td3, and Td4. The first to fourth capacitors C1, C2, C3, and C4 may be capacitors having the same capacitance. For example, the first to fourth capacitors C1, C2, C3, and C4 may all have capacitance of 2.5 picoFarads (pF).

Referring to FIG. 6, each of the (n)th scan clock signal SCCLK[n] to the (n+3)th scan clock signal SCCLK[n+3] applied to the scan output circuit unit 310 according to one embodiment of the present disclosure may swing between the first voltage level (or gate high voltage) and the second voltage level (or a gate low voltage), and may include a pulse period in which the first voltage level is maintained for a predetermined or selected horizontal period. For example, the pulse period of each of the (n)th scan clock signal SCCLK[n] to the (n+3)th scan clock signal SCCLK[n+3] may be maintained for two horizontal periods 2H, and the rising time point and the falling time point of each pulse period may be different from each other. Each of the (n)th scan clock signal SCCLK[n] to the (n+3)th scan clock signal SCCLK[n+3] may be sequentially shifted by a predetermined or selected period and may have the first voltage level for two horizontal periods 2H, and the adjacent scan clock signals may overlap each other for a period shorter than the two horizontal periods 2H. For example, the adjacent scan clock signals may overlap each other for one horizontal period 1H. It should be understood that signals being "sequentially shifted" includes the meaning that signals earlier in a sequence have pulse periods that begin before those of signals later in the sequence, such that a later signal of a neighboring pair of signals rises after the earlier signal of the neighboring pair. For example, as shown in FIG. 6, the pulse period of the (n)th scan clock signal SCCLK[n] has a rising edge that occurs before a rising edge of the pulse period of the (n+1)th scan clock signal SCCLK[n+1], which occurs before a rising edge of the pulse period of the (n+2)th scan clock signal SCCLK[n+2], and so on. Although the pulse periods shown in FIG. 6 are the same (i.e., 2H), "sequentially shifted" does not require that the pulse periods be the same.

Referring to FIGS. 5 and 6, in the scan output circuit unit 310, the first scan pull-up transistor Tu1 may output the (n)th scan clock signal SCCLK[n] as the (n)th scan signal SC[n] through the scan output node in response to the voltage of the first node Q. At this time, the voltage of the first node Q is bootstrapped by the first capacitor C1 formed between the gate electrode of the first scan pull-up transistor Tu1 and the scan output node.

The second scan pull-up transistor Tu2 may output the (n+1)th scan clock signal SCCLK[n+1] as the (n+1)th scan signal SC[n+1] through the scan output node in response to the voltage of the first node Q boosted by the first capacitor C1. At this time, the voltage of the boosted first node Q is again bootstrapped by the second capacitor C2 formed between the gate electrode of the second scan pull-up transistor Tu2 and the scan output node.

Subsequently, the third scan pull-up transistor Tu3 may output the (n+2)th scan clock signal SCCLK[n+2] as the (n+2)th scan signal SC[n+2] through the scan output node in response to the voltage of the first node Q boosted again by the second capacitor C2. At this time, the rising time point of the (n+2)th scan clock signal SCCLK[n+2] coincides with the falling time point of the (n)th scan clock signal SCCLK[n], and the first capacitor C1 and the third capacitor C3 formed between the gate electrode of the third scan pull-up transistor Tu3 and the scan output node are offset from each other so that the voltage of the first node Q is not additionally increased by the third capacitor C3, and the boosting voltage is maintained by the second capacitor C2.

The fourth scan pull-up transistor Tu4 may output the (n+3)th scan clock signal SCCLK[n+3] as the (n+3)th scan signal SC[n+3] through the scan output node in response to the voltage of the first node Q maintained by the third capacitor C3. At this time, the rising time point of the (n+3)th scan clock signal SCCLK[n+3] coincides with the falling time point of the (n+1)th scan clock signal SCCLK[n+1], and the second capacitor C2 and the fourth capacitor C4 formed between the gate electrode of the fourth scan pull-up transistor Tu4 and the scan output node are offset from each other so that the voltage of the first node Q is not additionally increased by the fourth capacitor C4, and the boosting voltage is maintained by the third capacitor C3, and the voltage of the first node Q is continuously reduced by the falling of the (n+2)th scan clock signal SCCLK[n+2] and the falling of the (n+3)th scan clock signal SCCLK[n+3].

As shown in FIGS. 5 and 6, in the scan output circuit unit 310 according to one embodiment of the present disclosure, there is proposed a method of arranging the capacitors C1, C2, C3, and C4 of the same capacitance for the respective first to fourth scan signal output buffers 311, 312, 313, and 314.

Accordingly, since the first scan signal output buffer 311 has a small influence on the first node Q, and the first capacitor C1 of the first scan signal output buffer 311 and the second capacitor C2 of the second scan signal output buffer 312 act as holding capacitors, a deviation Aq of the boosting level of the first node Q occurs. Accordingly, a deviation ΔV between the (n)th scan signal SC[n] output from the first scan signal output buffer 311 and the (n+1)th scan signal SC[n+1] output from the second scan signal output buffer 312 may occur, whereby a periodic luminance deviation may be generated on an image displayed on the display panel 110. In addition, the rising time of the (n)th scan signal SC[n] output from the first scan signal output buffer 311 may be delayed.

Accordingly, in order to realize a narrow bezel, inventors of the present disclosure propose a gate driving circuit having a new structure capable of outputting the 'j' (j is an integer of 2 or more) output signals, and reducing the output deviation of each scan signal when the plurality of scan signals are sequentially output from one stage circuit, and a display device comprising the same.

First Embodiment

Figure 7:
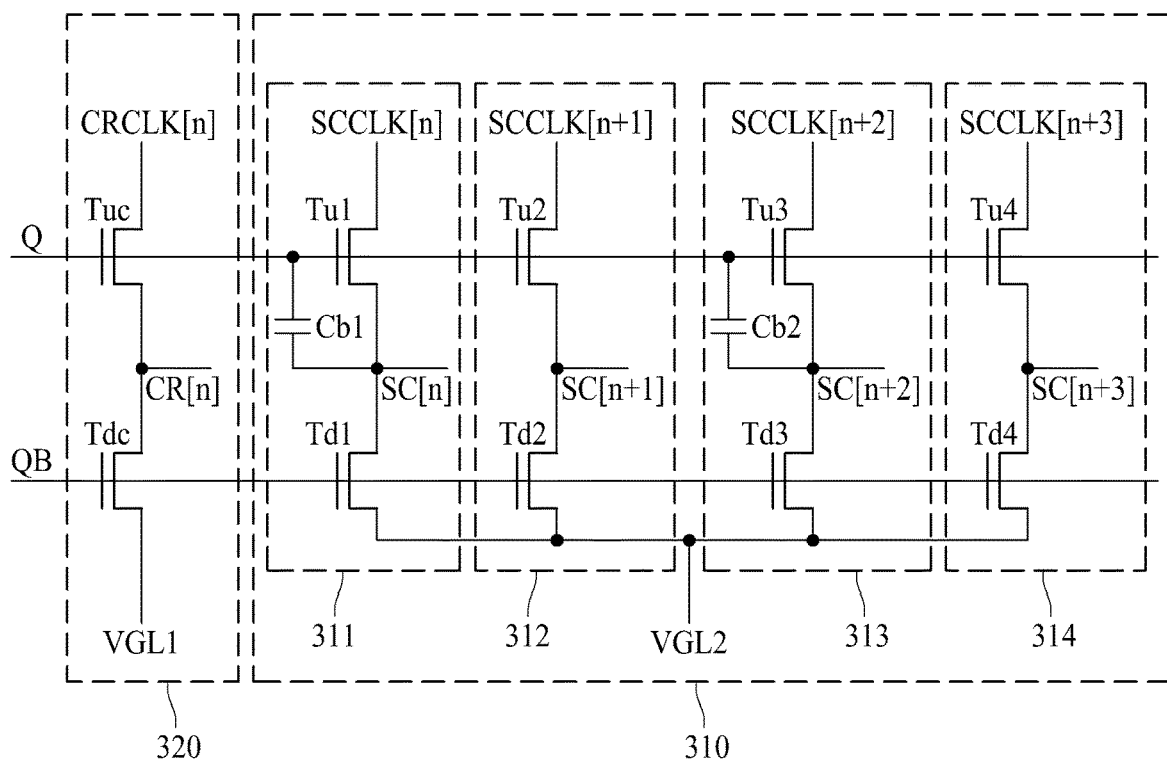
FIG. 7 is a circuit diagram of an output circuit unit according to the first embodiment of the present disclosure.
Figure 8:
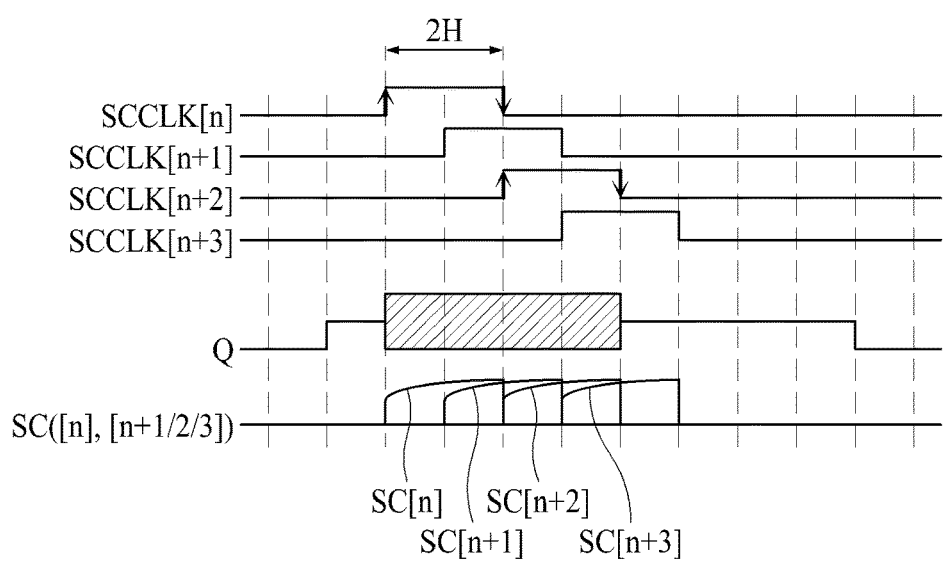
FIG. 8 is a waveform diagram showing a scan clock signal applied to the output circuit unit shown in FIG. 7, a scan signal output from the output circuit unit shown in FIG. 7, and a first node.

FIG. 7 is a circuit diagram of an output circuit unit according to the first embodiment of the present disclosure, and FIG. 8 is a waveform diagram showing a scan clock signal applied to the output circuit unit shown in FIG. 7, a scan signal output from the output circuit unit shown in FIG. 7, and a first node.

Referring to FIG. 7, the output circuit unit 300 according to the first embodiment of the present disclosure may include a scan output circuit unit 310 and a carry output circuit unit 320. The output circuit unit 300 according to the first embodiment of the present disclosure implements the scan output circuit unit 310 to output the four scan signals. For example, when the pixel PX of the display panel 110 has four subpixels, the output circuit unit 300 according to the first embodiment of the present disclosure may drive each subpixel by sequentially supplying the four scan signals to the corresponding gate lines GL by each subpixel. Alternatively, the output circuit unit 300 according to the first embodiment of the present disclosure may drive the pixels PX corresponding to the four horizontal lines by sequentially supplying the four scan signals to the gate lines GL corresponding to the four horizontal lines in the display panel 110. However, the output circuit unit 300 of the present disclosure is not limited to outputting only the scan signal, and may be implemented to provide a sense signal SENSE or an emission signal EM.

The carry output circuit unit 320 may output a carry clock signal CRCLK[n] as a carry signal CR[n] according to a voltage level of a first node Q or a second node QB. The carry output circuit unit 320 may include a carry signal output buffer including a carry pull-up transistor Tuc and a carry pull-down transistor Tdc. The carry output circuit unit 320 may be a single carry signal output buffer for outputting one carry clock signal CRCLK[n] among the plurality of carry clock signals CRCLKs as the carry signal CR[n].

The carry pull-up transistor Tuc and the carry pull-down transistor Tdc may be connected in series between a terminal to which the carry clock signal CRCLK[n] is applied and a terminal to which a first gate low voltage VGL1 is applied, and may output the carry signal CR[n] through a carry output node connected between the carry pull-up transistor Tuc and the carry pull-down transistor Tdc.

The carry pull-up transistor Tuc may output the carry signal CR[n] having a first voltage level corresponding to the carry clock signal CRCLK[n] in response to the voltage of the first node Q. The carry signal CR[n] may be supplied to any one of the next stage circuits as the previous carry signal (or gate start signal, set signal, etc.). For example, the carry pull-up transistor Tuc may include a gate electrode connected to the first node Q, a first source/drain electrode connected to the carry output node, and a second source/drain electrode connected to the terminal to which the carry clock signal CRCLK[n] is applied.

The carry pull-down transistor Tdc may output the carry signal CR[n] having a second voltage level corresponding to the first gate low voltage VGL1 (or gate low potential voltage, low potential voltage, etc.) according to the voltage of the second node QB. The carry signal CR[n] may be supplied to any one of the next stage circuits as the next carry signal (or reset signal). For example, the carry pull-down transistor Tdc may include a gate electrode connected to the second node QB, a first source/drain electrode connected to the carry output node, and a second source/drain electrode connected to the terminal to which the first gate low voltage VGL1 is applied.

The scan output circuit unit 310 according to the first embodiment of the present disclosure may include first to fourth scan signal output buffers 311, 312, 313, and 314 for outputting the four scan clock signals of the (n)th scan clock signal SCCLK[n] to the (n+3)th scan clock signal SCCLK[n+3] among the plurality of scan clock signals SCCLKs as the (n)th scan signal SC[n] to the (n+3)th scan signal SC[n+3], respectively.

The first scan signal output buffer 311 may include a first scan pull-up transistor Tu1, a first scan pull-down transistor Td1, and a first boosting capacitor Cb1. The second scan signal output buffer 312 may include a second scan pull-up transistor Tu2, and a second scan pull-down transistor Td2. The third scan signal output buffer 313 may include a third scan pull-up transistor Tu3, a third scan pull-down transistor Td3, and a second boosting capacitor Cb2. The fourth scan signal output buffer 314 may include a fourth scan pull-up transistor Tu4, and a fourth scan pull-down transistors Td4.

Each of the first to fourth scan pull-up transistors Tu1, Tu2, Tu3, and Tu4 and each of the first to fourth scan pull-down transistors Td1, Td2, Td3, and Td4 may be connected in series between a terminal to which the respective scan clock signals SCCLK[n] to SCCLK[n+3] are applied, and a terminal to which the second gate low voltage VGL2 is applied in common. The first boosting capacitor Cb1 may be connected between the gate electrode of the first scan pull-up transistor Tu1 and the output node between the first scan pull-up transistor Tu1 and the first scan pull-down transistor Td1, and the second boosting capacitor Cb2 may be connected between the gate electrode of the third scan pull-up transistor Tu3 and the output node between the third scan pull-up transistor Tu3 and the third scan pull-down transistor Td3. The first boosting capacitor Cb1 and the second boosting capacitor Cb2 may have different capacitances from each other. For example, the first boosting capacitor Cb1 may have a larger capacitance than the second boosting capacitor Cb2. For example, the first boosting capacitor Cb1 may have a capacitance greater than that of the second boosting capacitor Cb2 and may have a capacitance equal to or less than twice the capacitance of the second boosting capacitor Cb2. For example, the first boosting capacitor Cb1 may be set to 5 pF, and the second boosting capacitor Cb2 may be set to 2.5 pF.

Referring to FIG. 8, each of the (n)th scan clock signal SCCLK[n] to the (n+3)th scan clock signal SCCLK[n+3] applied to the scan output circuit unit 310 according to the first embodiment of the present disclosure may swing between the first voltage level (or gate high voltage) and the second voltage level (or gate low voltage), and may include a pulse period in which the first voltage level is maintained for a predetermined or selected horizontal period. For example, the pulse period of each of the (n)th scan clock signal SCCLK[n] to the (n+3)th scan clock signal SCCLK[n+3] may be maintained for two horizontal periods 2H, and the rising time point and the falling time point of each pulse period may be different from each other. Each of the (n)th scan clock signal SCCLK[n] to the (n+3)th scan clock signal SCCLK[n+3] may be sequentially shifted by a predetermined or selected period and may have the first voltage level for the two horizontal periods 2H, and the adjacent scan clock signals may overlap each other for a period shorter than the two horizontal periods 2H. For example, the adjacent scan clock signals may overlap each other for one horizontal period 1H. Also, the rising time point of any one scan clock signal among the (n)th scan clock signal SCCLK[n] to the (n+3)th scan clock signal SCCLK[n+3] may coincide with the falling time point of another scan clock signal. For example, the falling time point of the (n)th scan clock signal SCCLK[n] may coincide with the rising time point of the (n+2)th scan clock signal SCCLK[n+2], and the falling time point of the (n+1)th scan clock signal SCCLK[n+1] may coincide with the rising time point of the (n+3)th scan clock signal SCCLK[n+3].

Referring to FIGS. 7 and 8, in the scan output circuit unit 310 according to the first embodiment of the present disclosure, the first scan signal output buffer 311 may output the (n)th scan clock signal SCCLK[n], which is firstly applied among the (n)th scan clock signal SCCLK[n] to the (n+3)th scan clock signal SCCLK[n+3], as the (n)th scan signal SC[n] through the scan output node. In case of the first scan signal output buffer 311, the first boosting capacitor Cb1 may be disposed between the gate electrode of the first scan pull-up transistor Tu1 and the scan output node. The first scan signal output buffer 311 may be represented as a boosting scan signal output buffer for boosting the voltage of the first node Q by the first boosting capacitor Cb1.

The first scan pull-up transistor Tu1 of the first scan signal output buffer 311 may include a gate electrode connected to the first node Q, a first source/drain electrode connected to the scan output node, and a second source/drain electrode connected to a terminal of the (n)th scan clock signal SCCLK[n] firstly applied. The first scan pull-up transistor Tu1 may be represented as a boosting scan pull-up transistor which is switched according to the voltage of the first node Q to output the (n)th scan clock signal SCCLK[n] as the (n)th scan signal SC[n] having the first voltage level through the scan output node.

The first scan pull-down transistor Td1 of the first scan signal output buffer 311 may include a gate electrode connected to the second node QB, a first source/drain electrode connected to the scan output node, and a second source/drain electrode connected to a terminal to which the second gate low voltage VGL2 is applied. The first scan pull-down transistor Td1 may be represented by a boosting scan pull-down transistor which is switched according to the voltage of the second node QB and outputs the second gate low voltage VGL2 as the (n)th scan signal SC[n] having the second voltage level through the scan output node.

The first boosting capacitor Cb1 of the first scan signal output buffer 311 may be implemented between the first node Q and the scan output node. The first boosting capacitor Cb1 may generate the bootstrapping in the first node Q according to the phase transition (or rising of the pulse period) of the (n)th scan clock signal SCCLK[n] firstly applied. Since the first boosting capacitor Cb1 is not affected by the carry clock signal CRCLK[n], the boosting voltage of the first node Q may be increased. The first boosting capacitor Cb1 may be set to have sufficient capacitance to increase the bootstrapping time of the first node Q in order to improve the rising time of the (n)th scan signal SC[n] which is firstly output from the scan output circuit unit 310.

The second scan signal output buffer 312 may output the (n+1)th scan clock signal SCCLK[n+1] as the (n+1)th scan signal SC[n+1] through the scan output node. The second scan signal output buffer 312 may be represented as a normal scan signal output buffer in which the capacitor is not disposed.

The second scan pull-up transistor Tu2 of the second scan signal output buffer 312 may include a gate electrode connected to the first node Q, a first source/drain electrode connected to the scan output node, and a second source/drain electrode connected to a terminal of the (n+1)th scan clock signal SCCLK[n+1]. The second scan pull-up transistor Tu2 may be represented as a normal scan pull-up transistor which is switched according to the voltage of the first node Q boosted by the first boosting capacitor Cb1 to output the (n+1)th scan clock signal SCCLK[n+1] as the (n+1)th scan signal SC[n+1] having the first voltage level through the scan output node. At this time, since the (n+1)th scan clock signal SCCLK[n+1] overlaps the (n)th scan clock signal SCCLK[n] corresponding to the previous signal for one horizontal period 1H, the rising time of the pulse period does not coincide with the falling time of the other scan clock signal. Accordingly, the second scan signal output buffer 312 is not affected by the (n)th scan clock signal SCCLK[n], that is, the reinforcement or offsetting is not generated, whereby the boosting voltage is maintained by the first boosting capacitor Cb1.

The second scan pull-down transistor Td2 of the second scan signal output buffer 312 may include a gate electrode connected to the second node QB, a first source/drain electrode connected to the scan output node, and a second source/drain electrode connected to a terminal to which the second gate low voltage VGL2 is applied. The second scan pull-down transistor Td2 may be represented as a normal scan pull-down transistor which is switched according to the voltage of the second node QB and outputs the second gate low voltage VGL2 as the (n+1)th scan signal SC[n+1] having the second voltage level through the scan output node.

The third scan signal output buffer 313 may output the (n+2)th scan clock signal SCCLK[n+2] as the (n+2)th scan signal SC[n+2] through the scan output node. At this time, the (n+2)th scan clock signal SCCLK[n+2] may rise to coincide with the falling time point of the (n)th scan clock signal SCCLK[n] corresponding to the previous signal. In case of the third scan signal output buffer 313, the second boosting capacitor Cb2 may be disposed between the gate electrode of the third scan pull-up transistor Tu3 and the scan output node. The third scan signal output buffer 313 may be represented as a boosting scan signal output buffer for boosting the voltage of the first node Q by the second boosting capacitor Cb2.

The third scan pull-up transistor Tu3 of the third scan signal output buffer 313 may include a gate electrode connected to the first node Q, a first source/drain electrode connected to the scan output node, and a second source/drain electrode connected to a terminal of the (n+2)th scan clock signal SCCLK[n+2]. The third scan pull-up transistor Tu3 may be represented as a boosting scan pull-up transistor which is switched according to the voltage of the first node Q to output the (n+2)th scan clock signal SCCLK[n+2] as the (n+2)th scan signal SC[n+2] having the first voltage level through the scan output node.

The third scan pull-down transistor Td3 of the third scan signal output buffer 313 may include a gate electrode connected to the second node QB, a first source/drain electrode connected to the scan output node, and a second source/drain electrode connected to a terminal to which the second gate low voltage VGL2 is applied. The third scan pull-down transistor Td3 may be represented as a boosting scan pull-down transistor which is switched according to the voltage of the second node QB and outputs the second gate low voltage VGL2 as the (n+2)th scan signal SC[n+2] having the second voltage level through the scan output node.

The second boosting capacitor Cb2 of the third scan signal output buffer 313 may be implemented between the first node Q and the scan output node. The second boosting capacitor Cb2 may generate the bootstrapping in the first node Q according to the phase transition (or rising of pulse period) of the (n+2)th scan clock signal SCCLK [n+2]. According as the (n+2)th scan clock signal SCCLK[n+2] may rise to coincide with the falling time of the (n)th scan clock signal SCCLK[n] corresponding to the previous signal, and may be influenced to be offset, the second boosting capacitor Cb2 may boost the voltage of the first node Q so as to prevent the output deviation of the (n+2)th scan signal SC[n+2]. The second boosting capacitor Cb2 may be set to have the capacitance smaller than that of the first boosting capacitor Cb1, if the second boosting capacitor Cb2 may only generate a bootstrapping level sufficient to maintain the boosting voltage of the first node Q.

The fourth scan signal output buffer 314 may output the (n+3)th scan clock signal SCCLK[n+3] as the (n+3)th scan signal SC[n+3] through the scan output node. The fourth scan signal output buffer 314 may be represented as a normal scan signal output buffer in which a capacitor is not disposed.

The fourth scan pull-up transistor Tu4 of the fourth scan signal output buffer 314 may include a gate electrode connected to the first node Q, a first source/drain electrode connected to the scan output node, and a second source/drain electrode connected to a terminal of the (n+3)th scan clock signal SCCLK[n+3]. The fourth scan pull-up transistor Tu4 may be represented as a normal scan pull-up transistor which is switched according to the voltage of the first node Q boosted by the second boosting capacitor Cb2 to output the (n+3)th scan clock signal SCCLK[n+3] as the (n+3)th scan signal SC[n+3] having the first voltage level through the scan output node. At this time, since the (n+3)th scan clock signal SCCLK[n+3] may rise to coincide with the falling time point of the (n)th scan clock signal SCCLK[n] corresponding to the previous signal. However, since the capacitor is not disposed in the second scan signal output buffer 312, the reinforcement or offsetting is not generated without any influence, whereby the boosting voltage is maintained by the second boosting capacitor Cb2.

The fourth scan pull-down transistor Td4 of the fourth scan signal output buffer 314 may include a gate electrode connected to the second node QB, a first source/drain electrode connected to the scan output node, and a second source/drain electrode connected to a terminal to which the second gate low voltage VGL2 is applied. The fourth scan pull-down transistor Td4 may be represented as a normal scan pull-down transistor which is switched according to the voltage of the second node QB and outputs the second gate low voltage VGL2 as the (n+3)th scan signal SC[n+3] having the second voltage level through the scan output node.

As shown in FIGS. 7 and 8, in the scan output circuit unit 310 according to the first embodiment of the present disclosure, the boosting capacitors Cb1 and Cb2 are disposed only in the first scan signal output buffer 311 for firstly outputting the (n)th scan signal SC[n] and the third scan signal output buffer 313 influenced by the (n)th scan clock signal SCCLK[n] applied to the first scan signal output buffer 311.

Accordingly, the voltage of the first node Q is sufficiently boosted at the timing when the scan output circuit unit 310 firstly outputs the (n)th scan signal SC[n], whereby the rising time of the (n)th scan signal SC[n] may be improved, and the output deviation between the (n)th scan signal SC[n] and the next (n+1)th scan signal SC[n+1] to (n+3)th scan signal SC[n+3] may be reduced. In addition, the boosting capacitors Cb1 and Cb2 may be arranged only in some of the scan signal output buffers 311 and 313 of the scan output circuit unit 310 so that it is possible to reduce the size of the gate driving circuit GD, and thus to realize the narrow bezel with easiness.

Second Embodiment

Figure 9:
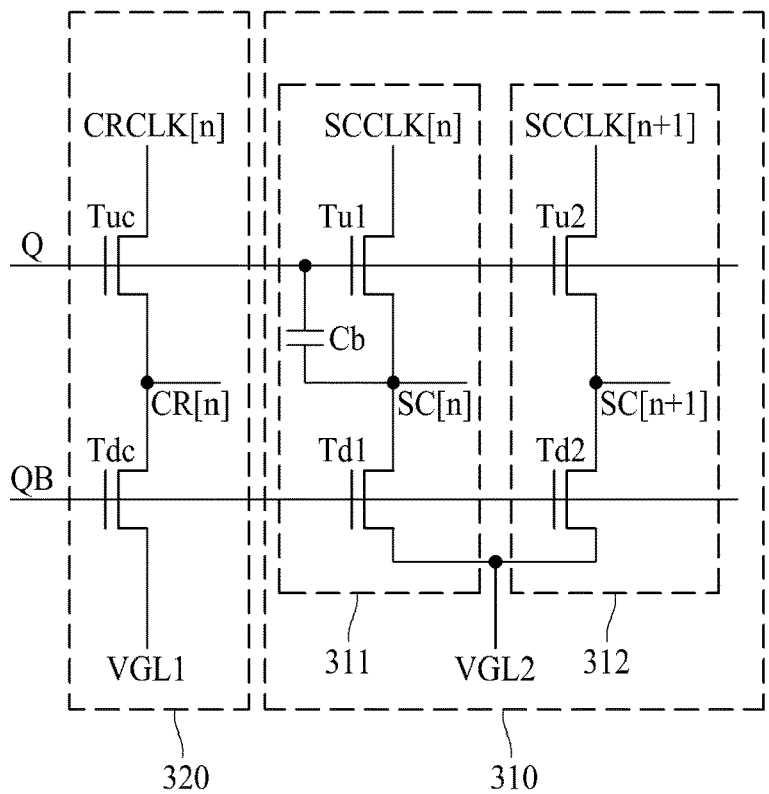
FIG. 9 is a circuit diagram of an output circuit unit according to the second embodiment of the present disclosure.
Figure 10:
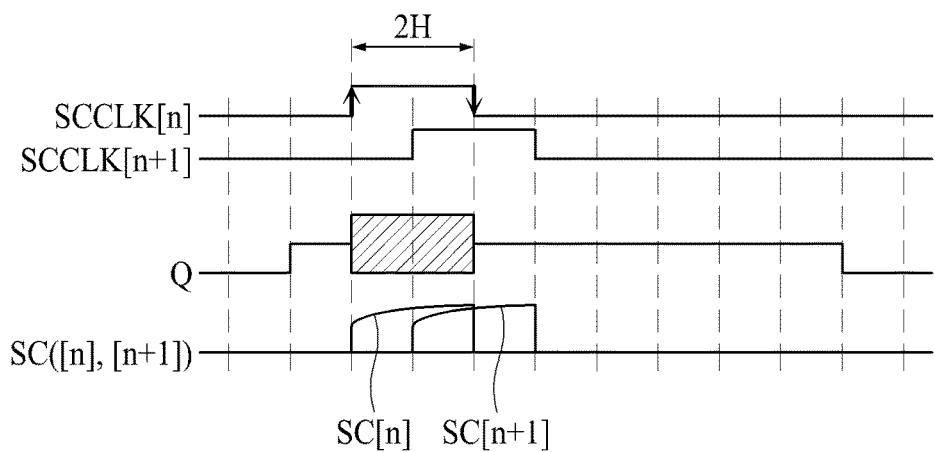
FIG. 10 is a waveform diagram showing a scan clock signal applied to the output circuit unit shown in FIG. 9, a scan signal output from the output circuit unit shown in FIG. 9, and a first node.

FIG. 9 is a circuit diagram of an output circuit unit according to the second embodiment of the present disclosure, and FIG. 10 is a waveform diagram showing a scan clock signal applied to the output circuit unit shown in FIG. 9, a scan signal output from the output circuit unit shown in FIG. 9, and a first node. In the description of the second embodiment, a description of the same configuration as that of the first embodiment will be omitted.

Referring to FIGS. 9 and 10, the output circuit unit 300 according to the second embodiment of the present disclosure implements a scan output circuit unit 310 to output two scan signals. For example, when the pixel PX of the display panel 110 has four subpixels, the output circuit unit 300 according to the second embodiment of the present disclosure may drive each subpixel by sequentially supplying the two scan signals to the gate lines GL corresponding to the two sub pixels of the four subpixels. Alternatively, the output circuit unit 300 according to the second embodiment of the present disclosure may drive the pixels PX corresponding to the two horizontal lines by sequentially supplying the two scan signals to the gate lines GL corresponding to the two horizontal lines of the display panel 110. However, the output circuit unit 300 according to the present disclosure is not limited to outputting only the scan signal, and may be implemented to provide a sense signal SENSE or an emission signal EM.

The scan output circuit unit 310 according to the second embodiment of the present disclosure may include first and second scan signal output buffers 311 and 312 for respectively outputting the (n)th scan clock signal SCCLK[n] and the (n+1)th scan clock signal SCCLK[n+1] among the plurality of scan clock signals SCCLKs as the (n)th scan signal SC[n] and the (n+1)th scan signal SC[n+1].

The first scan signal output buffer 311 may include a first scan pull-up transistor Tu1, a first scan pull-down transistor Td1, and a first boosting capacitor Cb1, and the second scan signal output buffer 312 may include a second scan pull-up transistor Tu2 and a second scan pull-down transistor Td2.

The first and second scan pull-up transistors Tu1 and Tu2 and the first and second scan pull-down transistors Td1 and Td2 may be connected in series between a terminal to which the scan clock signal SCCLK[n] and SCCLK[n+1] are applied and a terminal to which the second gate low voltage VGL2 is applied in common, and the first boosting capacitor Cb1 may be connected between the gate electrode of the first scan pull-up transistor Tu1 and an output node between the first scan pull-up transistor Tu1 and the first scan pull-down transistor Td1.

Referring to FIG. 10, the (n)th scan clock signal SCCLK[n] and the (n+1)th scan clock signal SCCLK[n+1] applied to the scan output circuit unit 310 according to the second embodiment of the present disclosure may include a pulse period which swings between a first voltage level (or gate high voltage) and a second voltage level (or gate low voltage) and is maintained at the first voltage level for a predetermined or selected horizontal period. For example, the pulse period of the (n)th scan clock signal SCCLK[n] and the (n+1)th scan clock signal SCCLK[n+1] may be maintained for two horizontal periods 2H, and the rising time and the falling time point of each pulse period may be different from each other. The (n)th scan clock signal SCCLK[n] and the (n+1)th scan clock signal SCCLK[n+1] are sequentially shifted by a predetermined or selected period and have the first voltage level for two horizontal periods, and the adjacent scan clock signals may overlap each other for a period shorter than the two horizontal periods 2H. For example, the adjacent scan clock signals may overlap each other during one horizontal period 1H. In addition, the rising time point and the falling time point in each of the (n)th scan clock signal SCCLK[n] and the (n+1)th scan clock signal SCCLK[n+1] may not coincide with each other.

Referring to FIGS. 9 and 10, in the scan output circuit unit 310 according to the second embodiment of the present disclosure, the first scan signal output buffer 311 may output the firstly-applied (n)th scan clock signal SCCLK[n] as the (n)th scan signal SC[n] through the scan output node. In the first scan signal output buffer 311, the first boosting capacitor Cb1 may be disposed between the gate electrode of the first scan pull-up transistor Tu1 and the scan output node. The first scan signal output buffer 311 may be represented as a boosting scan signal output buffer for boosting the voltage of the first node Q by the first boosting capacitor Cb1.

The first scan pull-up transistor Tu1 of the first scan signal output buffer 311 may include a gate electrode connected to the first node Q, a first source/drain electrode connected to the scan output node, and a second source/drain electrode connected to a terminal of the (n)th scan clock signal SCCLK[n] firstly applied. The first scan pull-up transistor Tu1 may be represented as a boosting scan pull-up transistor which is switched according to the voltage of the first node Q to output the (n)th scan clock signal SCCLK[n] as the (n)th scan signal SC[n] having the first voltage level through the scan output node.

The first scan pull-down transistor Td1 of the first scan signal output buffer 311 may include a gate electrode connected to the second node QB, a first source/drain electrode connected to the scan output node, and a second source/drain electrode connected to a terminal to which the second gate low voltage VGL2 is applied. The first scan pull-down transistor Td1 may be represented by a boosting scan pull-down transistor which is switched according to the voltage of the second node QB and outputs the second gate low voltage VGL2 as the (n)th scan signal SC[n] having the second voltage level through the scan output node.

The first boosting capacitor Cb1 of the first scan signal output buffer 311 may be implemented between the first node Q and the scan output node. The first boosting capacitor Cb1 may generate the bootstrapping in the first node Q according to the phase transition (or rising of the pulse period) of the (n)th scan clock signal SCCLK[n] firstly applied. Since the first boosting capacitor Cb1 is not affected by the carry clock signal CRCLK[n], the boosting voltage of the first node Q may be increased. The first boosting capacitor Cb1 may be set to have sufficient capacitance to increase the bootstrapping time of the first node Q in order to improve the rising time of the (n)th scan signal SC[n] which is firstly output from the scan output circuit unit 310.

The second scan signal output buffer 312 may output the (n+1)th scan clock signal SCCLK[n+1] as the (n+1)th scan signal SC[n+1] through the scan output node. The second scan signal output buffer 312 may be represented as a normal scan signal output buffer in which the capacitor is not disposed.

The second scan pull-up transistor Tu2 of the second scan signal output buffer 312 may include a gate electrode connected to the first node Q, a first source/drain electrode connected to the scan output node, and a second source/drain electrode connected to a terminal of the (n+1)th scan clock signal SCCLK[n+1]. The second scan pull-up transistor Tu2 may be represented as a normal scan pull-up transistor which is switched according to the voltage of the first node Q boosted by the first boosting capacitor Cb1 to output the (n+1)th scan clock signal SCCLK[n+1] as the (n+1)th scan signal SC[n+1] having the first voltage level through the scan output node. At this time, since the (n+1)th scan clock signal SCCLK[n+1] overlaps the (n)th scan clock signal SCCLK[n] corresponding to the previous signal for one horizontal period 1H, the rising time of the pulse period does not coincide with the falling time of the other scan clock signal. Accordingly, the second scan signal output buffer 312 is not affected by the (n)th scan clock signal SCCLK[n], that is, the reinforcement or offsetting is not generated, whereby the boosting voltage is maintained by the first boosting capacitor Cb1.

The second scan pull-down transistor Td2 of the second scan signal output buffer 312 may include a gate electrode connected to the second node QB, a first source/drain electrode connected to the scan output node, and a second source/drain electrode connected to a terminal to which the second gate low voltage VGL2 is applied. The second scan pull-down transistor Td2 may be represented as a normal scan pull-down transistor which is switched according to the voltage of the second node QB and outputs the second gate low voltage VGL2 as the (n+1)th scan signal SC[n+1] having the second voltage level through the scan output node.

Third Embodiment

Figure 11:
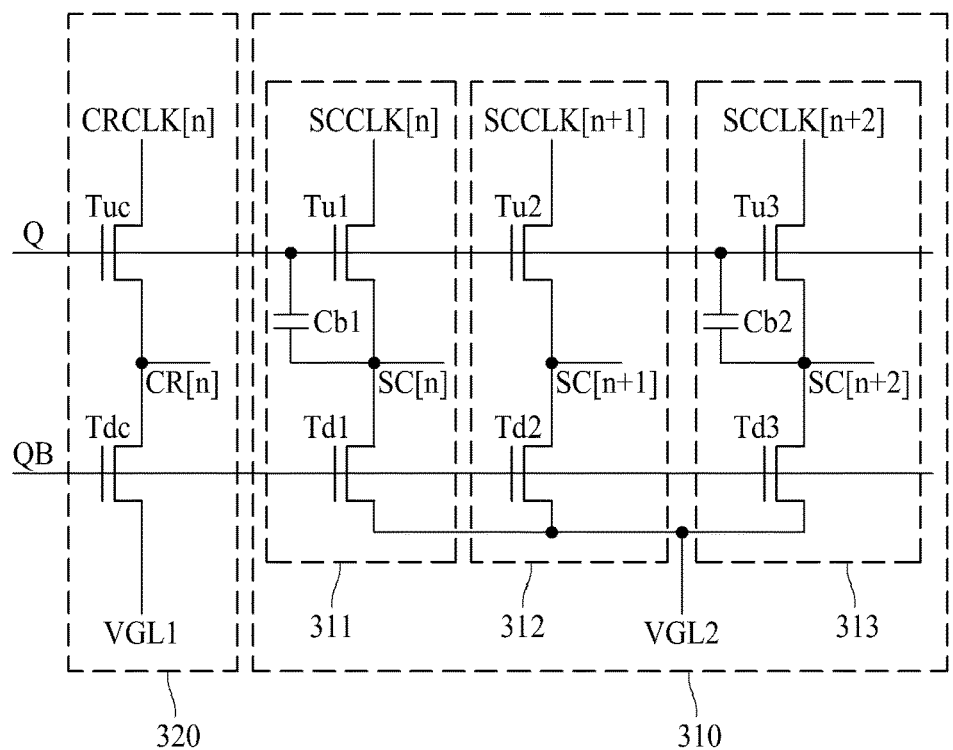
FIG. 11 is a circuit diagram of an output circuit unit according to the third embodiment of the present disclosure.
Figure 12:
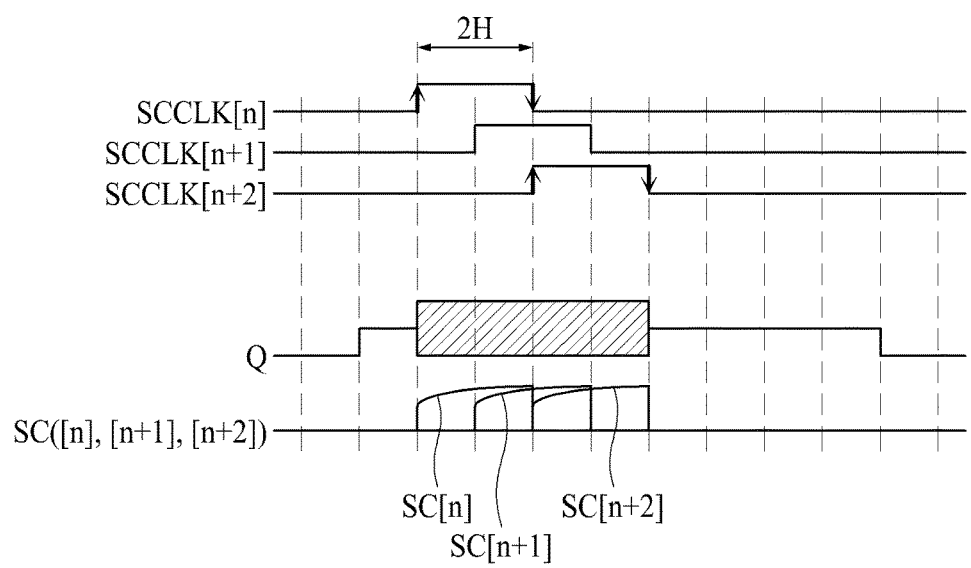
FIG. 12 is a waveform diagram showing a scan clock signal applied to the output circuit unit shown in FIG. 11, a scan signal output from the output circuit unit shown in FIG. 11, and a first node.

FIG. 11 is a circuit diagram of an output circuit unit according to the third embodiment of the present disclosure, and FIG. 12 is a waveform diagram showing a scan clock signal applied to the output circuit unit shown in FIG. 11, a scan signal output from the output circuit unit shown in FIG. 11, and a first node. In the description of the third embodiment, a description of the same configuration as those of the first and second embodiments will be omitted.

Referring to FIGS. 11 and 12, the output circuit unit 300 according to the third embodiment of the present disclosure implements a scan output circuit unit 310 to output three scan signals. For example, when the pixel PX of the display panel 110 has three subpixels, the output circuit unit 300 according to the third embodiment of the present disclosure may drive each subpixel by sequentially supplying the three scan signals to the gate lines GL corresponding to the three subpixels. Alternatively, the output circuit unit 300 according to the third embodiment of the present disclosure may drive the pixels PX corresponding to the three horizontal lines by sequentially supplying the three scan signals to the gate lines GL corresponding to the three horizontal lines of the display panel 110. However, the output circuit unit 300 according to the present disclosure is not limited to outputting only the scan signal, and may be implemented to provide a sense signal SENSE or an emission signal EM.

The scan output circuit unit 310 according to the third embodiment of the present disclosure may include first to third scan signal output buffers 311, 312, and 313 for outputting the (n)th scan clock signals SCCLK[n] to the (n+2)th scan clock signals SCCLK[n+2] among the plurality of scan clock signals SCCLKs as the (n)th scan signal SC[n] to the (n+2)th scan signal SC[n+2], respectively.

The first scan signal output buffer 311 may include a first scan pull-up transistor Tu1, a first scan pull-down transistor Td1, and a first boosting capacitor Cb1, and the second scan signal output buffer 312 may include a second scan pull-up transistor Tu2 and a second scan pull-down transistor Td2, and the third scan signal output buffer 313 may include a third scan pull-up transistor Tu3, a third scan pull-down transistor Td3, and a second boosting capacitor Cb2.

The first to third scan pull-up transistors Tu1, Tu2, and Tu3 and the first to third scan pull-down transistors Td1, Td2, and Td3 may be connected in series between a terminal to which the scan clock signals SCCLK[n] to SCCLK [n+2] are applied, and a terminal to which the second gate low voltage VGL2 is applied in common. The first boosting capacitor Cb1 may be connected between the gate electrode of the first scan pull-up transistor Tu1 and an output node between the first scan pull-up transistor Tu1 and the first scan pull-down transistor Td1, and the second boosting capacitor Cb2 may be connected between the gate electrode of the third scan pull-up transistor Tu3 and an output node between the third scan pull-up transistor Tu3 and the third scan pull-down transistor Td3. The first boosting capacitor Cb1 and the second boosting capacitor Cb2 may have different capacitances from each other. For example, the first boosting capacitor Cb1 may have a larger capacitance than the second boosting capacitor Cb2. For example, the first boosting capacitor Cb1 may have a capacitance greater than that of the second boosting capacitor Cb2 and may have a capacitance equal to or less than twice the capacitance of the second boosting capacitor Cb2.

Referring to FIG. 11, each of the (n)th scan clock signal SCCLK[n] to the (n+2)th scan clock signal SCCLK[n+2] applied to the scan output circuit unit 310 according to the third embodiment of the present disclosure may include a pulse period which swings between a first voltage level (or gate high voltage) and a second voltage level (or gate low voltage) and is maintained at the first voltage level for a predetermined or selected horizontal period. For example, the pulse period of each of the (n)th scan clock signal SCCLK[n] to the (n+2)th scan clock signal SCCLK[n+2] may be maintained for two horizontal periods 2H, and the rising time and the falling time point of each pulse period may be different from each other. Each of the (n)th scan clock signal SCCLK[n] to the (n+2)th scan clock signal SCCLK[n+2] may be sequentially shifted by a predetermined or selected period and have the first voltage level for the two horizontal periods 2H, and the adjacent scan clock signals may overlap each other for a period shorter than the two horizontal periods 2H. For example, the adjacent scan clock signals may overlap each other during one horizontal period 1H. In addition, the rising time point of any one scan clock signal of the (n)th scan clock signal SCCLK[n] to the (n+2)th scan clock signal SCCLK[n+2] may coincide with the falling time of another scan clock signal. For example, the falling time point of the (n)th scan clock signal SCCLK[n] may coincide with the rising time of the (n+2)th scan clock signal SCCLK[n+2].

Referring to FIGS. 11 and 12, in the scan output circuit unit 310 according to the third embodiment of the present disclosure, the first scan signal output buffer 311 may output the (n)th scan clock signal SCCLK[n] firstly applied from the (n)th scan clock signal SCCLK[n] to the (n+2)th scan clock signal SCCLK[n+2] as the (n)th scan signal SC[n] through the scan output node. In the first scan signal output buffer 311, the first boosting capacitor Cb1 may be disposed between the gate electrode of the first scan pull-up transistor Tu1 and the scan output node. The first scan signal output buffer 311 may be represented as a boosting scan signal output buffer for boosting the voltage of the first node Q by the first boosting capacitor Cb1.

The first scan pull-up transistor Tu1 of the first scan signal output buffer 311 may include a gate electrode connected to the first node Q, a first source/drain electrode connected to the scan output node, and a second source/drain electrode connected to a terminal of the (n)th scan clock signal SCCLK[n] firstly applied. The first scan pull-up transistor Tu1 may be represented as a boosting scan pull-up transistor which is switched according to the voltage of the first node Q to output the (n)th scan clock signal SCCLK[n] as the (n)th scan signal SC[n] having the first voltage level through the scan output node.

The first scan pull-down transistor Td1 of the first scan signal output buffer 311 may include a gate electrode connected to the second node QB, a first source/drain electrode connected to the scan output node, and a second source/drain electrode connected to a terminal to which the second gate low voltage VGL2 is applied. The first scan pull-down transistor Td1 may be represented by a boosting scan pull-down transistor which is switched according to the voltage of the second node QB and outputs the second gate low voltage VGL2 as the (n)th scan signal SC[n] having the second voltage level through the scan output node.

The first boosting capacitor Cb1 of the first scan signal output buffer 311 may be implemented between the first node Q and the scan output node. The first boosting capacitor Cb1 may generate the bootstrapping in the first node Q according to the phase transition (or rising of the pulse period) of the (n)th scan clock signal SCCLK[n] firstly applied. Since the first boosting capacitor Cb1 is not affected by the carry clock signal CRCLK[n], the boosting voltage of the first node Q may be increased. The first boosting capacitor Cb1 may be set to have sufficient capacitance to increase the bootstrapping time of the first node Q in order to improve the rising time of the (n)th scan signal SC[n] which is firstly output from the scan output circuit unit 310.

The second scan signal output buffer 312 may output the (n+1)th scan clock signal SCCLK[n+1] as the (n+1)th scan signal SC[n+1] through the scan output node. The second scan signal output buffer 312 may be represented as a normal scan signal output buffer in which the capacitor is not disposed.

The second scan pull-up transistor Tu2 of the second scan signal output buffer 312 may include a gate electrode connected to the first node Q, a first source/drain electrode connected to the scan output node, and a second source/drain electrode connected to a terminal of the (n+1)th scan clock signal SCCLK[n+1]. The second scan pull-up transistor Tu2 may be represented as a normal scan pull-up transistor which is switched according to the voltage of the first node Q boosted by the first boosting capacitor Cb1 to output the (n+1)th scan clock signal SCCLK[n+1] as the (n+1)th scan signal SC[n+1] having the first voltage level through the scan output node. At this time, since the (n+1)th scan clock signal SCCLK[n+1] overlaps the (n)th scan clock signal SCCLK[n] corresponding to the previous signal for one horizontal period 1H, the rising time of the pulse period does not coincide with the falling time of the other scan clock signal. Accordingly, the second scan signal output buffer 312 is not affected by the (n)th scan clock signal SCCLK[n], that is, the reinforcement or offsetting is not generated, whereby the boosting voltage is maintained by the first boosting capacitor Cb1.

The second scan pull-down transistor Td2 of the second scan signal output buffer 312 may include a gate electrode connected to the second node QB, a first source/drain electrode connected to the scan output node, and a second source/drain electrode connected to a terminal to which the second gate low voltage VGL2 is applied. The second scan pull-down transistor Td2 may be represented as a normal scan pull-down transistor which is switched according to the voltage of the second node QB and outputs the second gate low voltage VGL2 as the (n+1)th scan signal SC[n+1] having the second voltage level through the scan output node.

The third scan signal output buffer 313 may output the (n+2)th scan clock signal SCCLK[n+2] as the (n+2)th scan signal SC[n+2] through the scan output node. At this time, the (n+2)th scan clock signal SCCLK[n+2] may rise to coincide with the falling time point of the (n)th scan clock signal SCCLK[n] corresponding to the previous signal. In case of the third scan signal output buffer 313, the second boosting capacitor Cb2 may be disposed between the gate electrode of the third scan pull-up transistor Tu3 and the scan output node. The third scan signal output buffer 313 may be represented as a boosting scan signal output buffer for boosting the voltage of the first node Q by the second boosting capacitor Cb2.

The third scan pull-up transistor Tu3 of the third scan signal output buffer 313 may include a gate electrode connected to the first node Q, a first source/drain electrode connected to the scan output node, and a second source/drain electrode connected to a terminal of the (n+2)th scan clock signal SCCLK[n+2]. The third scan pull-up transistor Tu3 may be represented as a boosting scan pull-up transistor which is switched according to the voltage of the first node Q and outputs the (n+2)th scan clock signal SCCLK[n+2] as the (n+2)th scan signal SC[n+2] having the first voltage level through the scan output node.

The third scan pull-down transistor Td3 of the third scan signal output buffer 313 may include a gate electrode connected to the second node QB, a first source/drain electrode connected to the scan output node, and a second source/drain electrode connected to a terminal to which the second gate low voltage VGL2 is applied. The third scan pull-down transistor Td3 may be represented as a boosting scan pull-down transistor which is switched according to the voltage of the second node QB and outputs the second gate low voltage VGL2 as the (n+2)th scan signal SC[n+2] having the second voltage level through the scan output node.

The second boosting capacitor Cb2 of the third scan signal output buffer 313 may be implemented between the first node Q and the scan output node. The second boosting capacitor Cb2 may generate the bootstrapping in the first node Q according to the phase transition (or rising of pulse period) of the (n+2)th scan clock signal SCCLK[n+2]. According as the (n+2)th scan clock signal SCCLK[n+2] may rise to coincide with the falling time of the (n)th scan clock signal SCCLK[n] corresponding to the previous signal, and may be influenced to be offset, the second boosting capacitor Cb2 may boost the voltage of the first node Q so as to prevent the output deviation of the (n+2)th scan signal SC[n+2]. The second boosting capacitor Cb2 may be set to have the capacitance smaller than that of the first boosting capacitor Cb1, if the second boosting capacitor Cb2 may only generate a bootstrapping level sufficient to maintain the boosting voltage of the first node Q.

Fourth Embodiment

Figure 13:
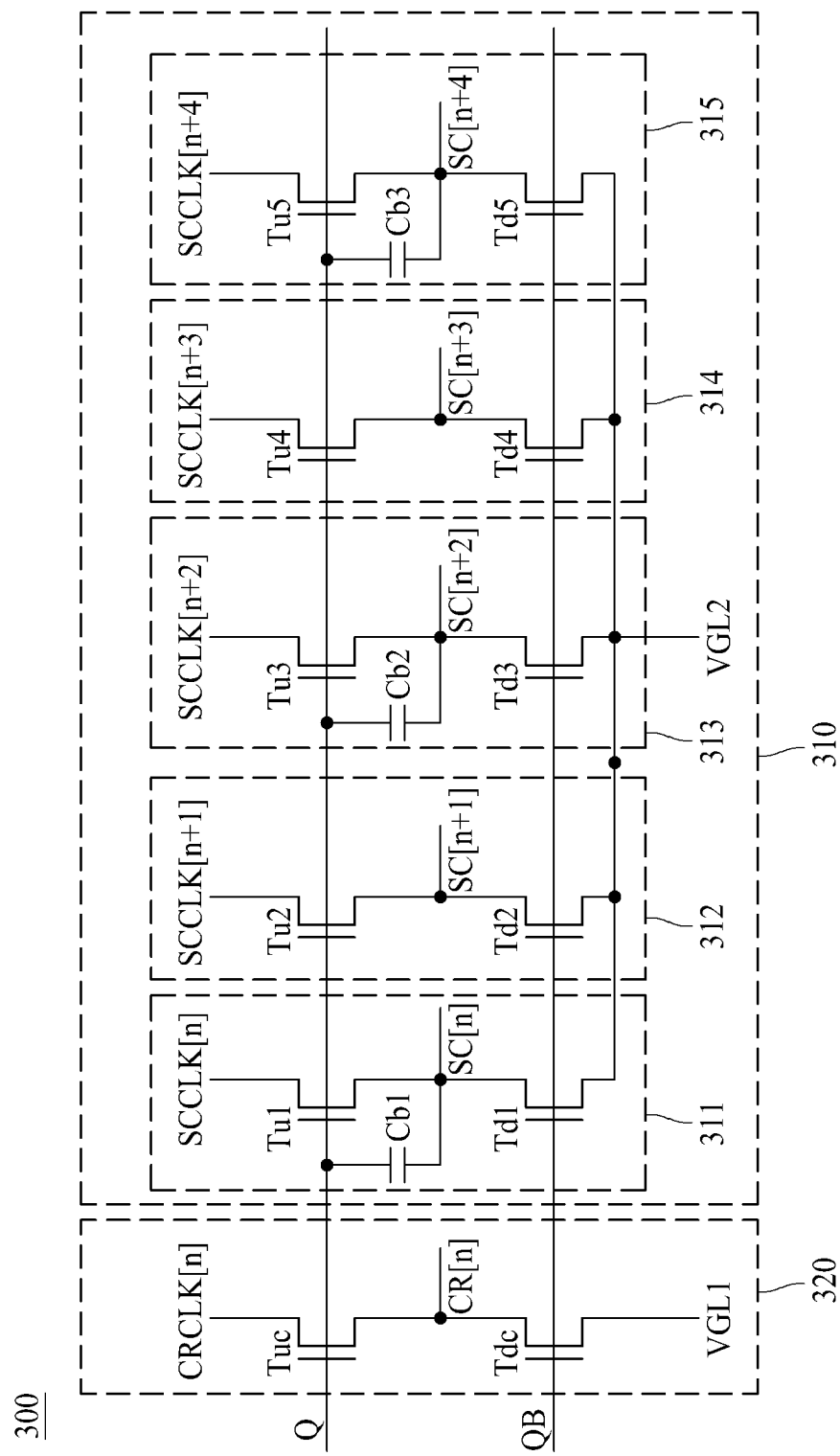
FIG. 13 is a circuit diagram of an output circuit unit according to the fourth embodiment of the present disclosure.
Figure 14:
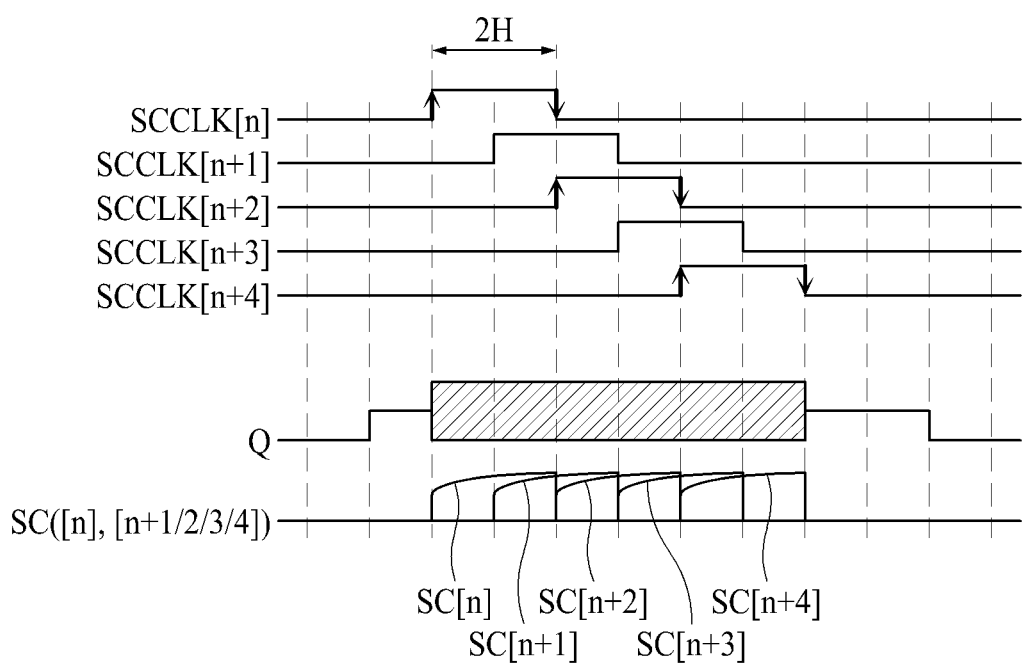
FIG. 14 is a waveform diagram showing a scan clock signal applied to the output circuit unit shown in FIG. 13, a scan signal output from the output circuit unit shown in FIG. 13, and a first node.

FIG. 13 is a circuit diagram of an output circuit unit according to the fourth embodiment of the present disclosure, and FIG. 14 is a waveform diagram showing a scan clock signal applied to the output circuit unit shown in FIG. 13, a scan signal output from the output circuit unit shown in FIG. 13, and a first node. In the description of the third embodiment, a description of the same configuration as those of the first to third embodiments will be omitted.

Referring to FIGS. 13 and 14, the output circuit unit 300 according to the fourth embodiment of the present disclosure implements a scan output circuit unit 310 to output five scan signals. For example, when the pixel PX of the display panel 110 has three or four subpixels, the output circuit unit 300 according to the fourth embodiment of the present disclosure may drive each subpixel by sequentially supplying the five scan signals to the gate lines GL corresponding to the five subpixels. Alternatively, the output circuit unit 300 according to the fourth embodiment of the present disclosure may drive the pixels PX corresponding to the five horizontal lines by sequentially supplying the five scan signals to the gate lines GL corresponding to the five horizontal lines of the display panel 110. However, the output circuit unit 300 according to the present disclosure is not limited to outputting only the scan signal, and may be implemented to provide a sense signal SENSE or an emission signal EM.

The scan output circuit unit 310 according to the fourth embodiment of the present disclosure may include first to fifth scan signal output buffers 311, 312, 313, 314, and 315 for outputting the (n)th scan clock signals SCCLK[n] to the (n+4)th scan clock signals SCCLK[n+4] among the plurality of scan clock signals SCCLKs as the (n)th scan signal SC[n] to the (n+4)th scan signal SC[n+4], respectively.

The first scan signal output buffer 311 may include a first scan pull-up transistor Tu1, a first scan pull-down transistor Td1, and a first boosting capacitor Cb1, and the second scan signal output buffer 312 may include a second scan pull-up transistor Tu2 and a second scan pull-down transistor Td2, and the third scan signal output buffer 313 may include a third scan pull-up transistor Tu3, a third scan pull-down transistor Td3, and a second boosting capacitor Cb2. The fourth scan signal output buffer 314 may include a fourth scan pull-up transistor Tu4 and a fourth scan pull-down transistor Td4, and the fifth scan signal output buffer 315 may include a fifth scan pull-up transistor Tu5, a fifth scan pull-down transistor Td5, and a third boosting capacitor Cb3.

The first to fifth scan pull-up transistors Tu1, Tu2, Tu3, Tu4, and Tu5 and the first to fifth scan pull-down transistors Td1, Td2, Td3, Td4, and Td5 may be connected in series between a terminal to which the scan clock signals SCCLK[n] to SCCLK[n+4] are applied, and a terminal to which the second gate low voltage VGL2 is applied in common. The first boosting capacitor Cb1 may be connected between the gate electrode of the first scan pull-up transistor Tu1 and an output node between the first scan pull-up transistor Tu1 and the first scan pull-down transistor Td1, the second boosting capacitor Cb2 may be connected between the gate electrode of the third scan pull-up transistor Tu3 and an output node between the third scan pull-up transistor Tu3 and the third scan pull-down transistor Td3, and the third boosting capacitor Cb3 may be connected between the gate electrode of the fifth scan pull-up transistor Tu5 and an output node between the fifth scan pull-up transistor Tu5 and the fifth scan pull-down transistor Td5. A capacitance of the first boosting capacitor Cb1 may be larger than a capacitance of each of the second and third boosting capacitors Cb2 and Cb3. Also, the second and third boosting capacitors Cb2 and Cb3 may have the same capacitance or different capacitances. Also, the first boosting capacitor Cb may have a capacitance equal to or less than a total capacitance of the second and third boosting capacitors Cb2 and Cb3. For example, the first boosting capacitor Cb1 may have a greater capacitance than each of the second and third boosting capacitors Cb2 and Cb3. In addition, the first boosting capacitor Cb1 may have a capacitance greater than that of the second boosting capacitor Cb2 and may have a capacitance equal to or less than twice the capacitance of the second boosting capacitor Cb2. Also, the first boosting capacitor Cb1 may have a capacitance greater than that of the third boosting capacitor Cb3 and may have a capacitance equal to or less than twice the capacitance of the third boosting capacitor Cb3. In addition, twice the capacitance of the first boosting capacitor Cb1 may have a capacitance equal to or less than twice the capacitance sum of the second and third boosting capacitors Cb2 and Cb3.

Referring to FIG. 14, the (n)th scan clock signal SCCLK[n] to the (n+4)th scan clock signal SCCLK[n+4] applied to the scan output circuit unit 310 according to the fourth embodiment of the present disclosure may include a pulse period which swings between a first voltage level (or gate high voltage) and a second voltage level (or gate low voltage) and is maintained at the first voltage level for a predetermined or selected horizontal period. For example, the pulse period of each of the (n)th scan clock signal SCCLK[n] to the (n+4)th scan clock signal SCCLK[n+4] may be maintained for two horizontal periods 2H, and the rising time and the falling time point of each pulse period may be different from each other. Each of the (n)th scan clock signal SCCLK[n] to the (n+4)th scan clock signal SCCLK[n+4] may be sequentially shifted by a predetermined or selected period and have the first voltage level for the two horizontal periods 2H, and the adjacent scan clock signals may overlap each other for a period shorter than the two horizontal periods 2H. For example, the adjacent scan clock signals may overlap each other during one horizontal period 1H. In addition, the rising time point of any one scan clock signal of the (n)th scan clock signal SCCLK[n] to the (n+4)th scan clock signal SCCLK[n+4] may coincide with the falling time of another scan clock signal. For example, the falling time point of the (n)th scan clock signal SCCLK[n] may coincide with the rising time of the (n+2)th scan clock signal SCCLK[n+2], the falling time point of the (n+1)th scan clock signal SCCLK[n+1] may coincide with the rising time of the (n+3)th scan clock signal SCCLK[n+3], and the falling time point of the (n+2)th scan clock signal SCCLK[n+2] may coincide with the rising time of the (n+4)th scan clock signal SCCLK[n+4].

Referring to FIGS. 13 and 14, in the scan output circuit unit 310 according to the fourth embodiment of the present disclosure, the first scan signal output buffer 311 may output the (n)th scan clock signal SCCLK[n] firstly applied from the (n)th scan clock signal SCCLK[n] to the (n+4)th scan clock signal SCCLK[n+4] as the (n)th scan signal SC[n] through the scan output node. In the first scan signal output buffer 311, the first boosting capacitor Cb1 may be disposed between the gate electrode of the first scan pull-up transistor Tu1 and the scan output node. The first scan signal output buffer 311 may be represented as a boosting scan signal output buffer for boosting the voltage of the first node Q by the first boosting capacitor Cb1.

The first scan pull-up transistor Tu1 of the first scan signal output buffer 311 may include a gate electrode connected to the first node Q, a first source/drain electrode connected to the scan output node, and a second source/drain electrode connected to a terminal of the (n)th scan clock signal SCCLK[n] firstly applied. The first scan pull-up transistor Tu1 may be represented as a boosting scan pull-up transistor which is switched according to the voltage of the first node Q to output the (n)th scan clock signal SCCLK[n] as the (n)th scan signal SC[n] having the first voltage level through the scan output node.

The first scan pull-down transistor Td1 of the first scan signal output buffer 311 may include a gate electrode connected to the second node QB, a first source/drain electrode connected to the scan output node, and a second source/drain electrode connected to a terminal to which the second gate low voltage VGL2 is applied. The first scan pull-down transistor Td1 may be represented by a boosting scan pull-down transistor which is switched according to the voltage of the second node QB and outputs the second gate low voltage VGL2 as the (n)th scan signal SC[n] having the second voltage level through the scan output node.

The first boosting capacitor Cb1 of the first scan signal output buffer 311 may be implemented between the first node Q and the scan output node. The first boosting capacitor Cb1 may generate the bootstrapping in the first node Q according to the phase transition (or rising of the pulse period) of the (n)th scan clock signal SCCLK[n] firstly applied. Since the first boosting capacitor Cb1 is not affected by the carry clock signal CRCLK[n], the boosting voltage of the first node Q may be increased. The first boosting capacitor Cb1 may be set to have sufficient capacitance to increase the bootstrapping time of the first node Q in order to improve the rising time of the (n)th scan signal SC[n] which is firstly output from the scan output circuit unit 310.

The second scan signal output buffer 312 may output the (n+1)th scan clock signal SCCLK[n+1] as the (n+1)th scan signal SC[n+1] through the scan output node. The second scan signal output buffer 312 may be represented as a normal scan signal output buffer in which the capacitor is not disposed.

The second scan pull-up transistor Tu2 of the second scan signal output buffer 312 may include a gate electrode connected to the first node Q, a first source/drain electrode connected to the scan output node, and a second source/drain electrode connected to a terminal of the (n+1)th scan clock signal SCCLK[n+1]. The second scan pull-up transistor Tu2 may be represented as a normal scan pull-up transistor which is switched according to the voltage of the first node Q boosted by the first boosting capacitor Cb1 to output the (n+1)th scan clock signal SCCLK[n+1] as the (n+1)th scan signal SC[n+1] having the first voltage level through the scan output node. At this time, since the (n+1)th scan clock signal SCCLK[n+1] overlaps the (n)th scan clock signal SCCLK[n] corresponding to the previous signal for one horizontal period 1H, the rising time of the pulse period does not coincide with the falling time of the other scan clock signal. Accordingly, the second scan signal output buffer 312 is not affected by the (n)th scan clock signal SCCLK[n], that is, the reinforcement or offsetting is not generated, whereby the boosting voltage is maintained by the first boosting capacitor Cb1.

The second scan pull-down transistor Td2 of the second scan signal output buffer 312 may include a gate electrode connected to the second node QB, a first source/drain electrode connected to the scan output node, and a second source/drain electrode connected to a terminal to which the second gate low voltage VGL2 is applied. The second scan pull-down transistor Td2 may be represented as a normal scan pull-down transistor which is switched according to the voltage of the second node QB and outputs the second gate low voltage VGL2 as the (n+1)th scan signal SC[n+1] having the second voltage level through the scan output node.

The third scan signal output buffer 313 may output the (n+2)th scan clock signal SCCLK[n+2] as the (n+2)th scan signal SC[n+2] through the scan output node. At this time, the (n+2)th scan clock signal SCCLK[n+2] may rise to coincide with the falling time point of the (n)th scan clock signal SCCLK[n] corresponding to the previous signal. In case of the third scan signal output buffer 313, the second boosting capacitor Cb2 may be disposed between the gate electrode of the third scan pull-up transistor Tu3 and the scan output node. The third scan signal output buffer 313 may be represented as a boosting scan signal output buffer for boosting the voltage of the first node Q by the second boosting capacitor Cb2.

The third scan pull-up transistor Tu3 of the third scan signal output buffer 313 may include a gate electrode connected to the first node Q, a first source/drain electrode connected to the scan output node, and a second source/drain electrode connected to a terminal of the (n+2)th scan clock signal SCCLK[n+2]. The third scan pull-up transistor Tu3 may be represented as a boosting scan pull-up transistor which is switched according to the voltage of the first node Q to output the (n+2)th scan clock signal SCCLK[n+2] as the (n+2)th scan signal SC[n+2] having the first voltage level through the scan output node.

The third scan pull-down transistor Td3 of the third scan signal output buffer 313 may include a gate electrode connected to the second node QB, a first source/drain electrode connected to the scan output node, and a second source/drain electrode connected to a terminal to which the second gate low voltage VGL2 is applied. The third scan pull-down transistor Td3 may be represented as a boosting scan pull-down transistor which is switched according to the voltage of the second node QB and outputs the second gate low voltage VGL2 as the (n+2)th scan signal SC[n+2] having the second voltage level through the scan output node.

The second boosting capacitor Cb2 of the third scan signal output buffer 313 may be implemented between the first node Q and the scan output node. The second boosting capacitor Cb2 may generate the bootstrapping in the first node Q according to the phase transition (or rising of pulse period) of the (n+2)th scan clock signal SCCLK [n+2]. According as the (n+2)th scan clock signal SCCLK[n+2] may rise to coincide with the falling time of the (n)th scan clock signal SCCLK[n] corresponding to the previous signal, and may be influenced to be offset, the second boosting capacitor Cb2 may boost the voltage of the first node Q so as to prevent the output deviation of the (n+2)th scan signal SC[n+2]. The second boosting capacitor Cb2 may be set to have the capacitance smaller than that of the first boosting capacitor Cb1, if the second boosting capacitor Cb2 may only generate a bootstrapping level sufficient to maintain the boosting voltage of the first node Q.

The fourth scan signal output buffer 343 may output the (n+3)th scan clock signal SCCLK[n+3] as the (n+3)th scan signal SC[n+3] through the scan output node. The fourth scan signal output buffer 314 may be represented as a normal scan signal output buffer where the capacitor is not disposed.

The fourth scan pull-up transistor Tu4 of the fourth scan signal output buffer 314 may include a gate electrode connected to the first node Q, a first source/drain electrode connected to the scan output node, and a second source/drain electrode connected to a terminal of the (n+3)th scan clock signal SCCLK[n+3]. The fourth scan pull-up transistor Tu4 may be represented as a normal scan pull-up transistor which is switched according to the voltage of the first node Q boosted by the second boosting capacitor Cb2 and outputs the (n+3)th scan clock signal SCCLK[n+3] as the (n+3)th scan signal SC[n+3] having the first voltage level through the scan output node. At this time, the (n+3)th scan clock signal SCCLK[n+3] may rise to coincide with the falling time point of the (n+1)th scan clock signal SCCLK[n+1] corresponding to the previous signal. However, since the capacitor is not disposed in the second scan signal output buffer 312, the reinforcement or offsetting is not generated, whereby the boosting voltage is maintained by the second boosting capacitor Cb2.

The fourth scan pull-down transistor Td4 of the fourth scan signal output buffer 312 may include a gate electrode connected to the second node QB, a first source/drain electrode connected to the scan output node, and a second source/drain electrode connected to a terminal to which the second gate low voltage VGL2 is applied. The fourth scan pull-down transistor Td4 may be represented as a normal scan pull-down transistor which is switched according to the voltage of the second node QB and outputs the second gate low voltage VGL2 as the (n+3)th scan signal SC[n+3] having the second voltage level through the scan output node.

The fifth scan signal output buffer 315 may output the (n+4)th scan clock signal SCCLK[n+4] as the (n+4)th scan signal SC[n+4] through the scan output node. At this time, the (n+4)th scan clock signal SCCLK[n+4] may rise to coincide with the falling time point of the (n+2)th scan clock signal SCCLK[n+2] corresponding to the previous signal. In case of the fifth scan signal output buffer 315, the third boosting capacitor Cb3 may be disposed between the gate electrode of the fifth scan pull-up transistor Tu5 and the scan output node. The fifth scan signal output buffer 315 may be represented as a boosting scan signal output buffer for boosting the voltage of the first node Q by the third boosting capacitor Cb3.

The fifth scan pull-up transistor Tu5 of the fifth scan signal output buffer 315 may include a gate electrode connected to the first node Q, a first source/drain electrode connected to the scan output node, and a second source/drain electrode connected to a terminal of the (n+4)th scan clock signal SCCLK[n+4]. The fifth scan pull-up transistor Tu5 may be represented as a boosting scan pull-up transistor which is switched according to the voltage of the first node Q to output the (n+4)th scan clock signal SCCLK[n+4] as the (n+4)th scan signal SC[n+4] having the first voltage level through the scan output node.

The fifth scan pull-down transistor Td5 of the fifth scan signal output buffer 315 may include a gate electrode connected to the second node QB, a first source/drain electrode connected to the scan output node, and a second source/drain electrode connected to a terminal to which the second gate low voltage VGL2 is applied. The fifth scan pull-down transistor Td5 may be represented as a boosting scan pull-down transistor which is switched according to the voltage of the second node QB and outputs the second gate low voltage VGL2 as the (n+4)th scan signal SC[n+4] having the second voltage level through the scan output node.

The third boosting capacitor Cb3 of the fifth scan signal output buffer 315 may be implemented between the first node Q and the scan output node. The third boosting capacitor Cb3 may generate the bootstrapping in the first node Q according to the phase transition (or rising of pulse period) of the (n+4)th scan clock signal SCCLK [n+4]. According as the (n+4)th scan clock signal SCCLK[n+4] may rise to coincide with the falling time of the (n+2)th scan clock signal SCCLK[n+2] corresponding to the previous signal, and may be influenced to be offset, the third boosting capacitor Cb3 may boost the voltage of the first node Q so as to prevent the output deviation of the (n+4)th scan signal SC[n+4]. The third boosting capacitor Cb3 may be set to have the capacitance smaller than that of the first boosting capacitor Cb1, if the third boosting capacitor Cb3 may only generate a bootstrapping level sufficient to maintain the boosting voltage of the first node Q. Also, the second and third boosting capacitors Cb2 and Cb3 may have the same capacitance or different capacitances. Also, the first boosting capacitor Cb may have a capacitance equal to or less than a total capacitance corresponding to the sum of the second and third boosting capacitors Cb2 and Cb3. For example, the first boosting capacitor Cb1 may have a greater capacitance than each of the second and third boosting capacitors Cb2 and Cb3. In addition, the first boosting capacitor Cb1 may have a capacitance greater than that of the second boosting capacitor Cb2 and may have a capacitance equal to or less than twice the capacitance of the second boosting capacitor Cb2. Also, the first boosting capacitor Cb1 may have a capacitance greater than that of the third boosting capacitor Cb3 and may have a capacitance equal to or less than twice the capacitance of the third boosting capacitor Cb3. In addition, twice the capacitance of the first boosting capacitor Cb1 may have a capacitance equal to or less than twice the capacitance sum of the second and third boosting capacitors Cb2 and Cb3.

Fifth Embodiment

Figure 15:
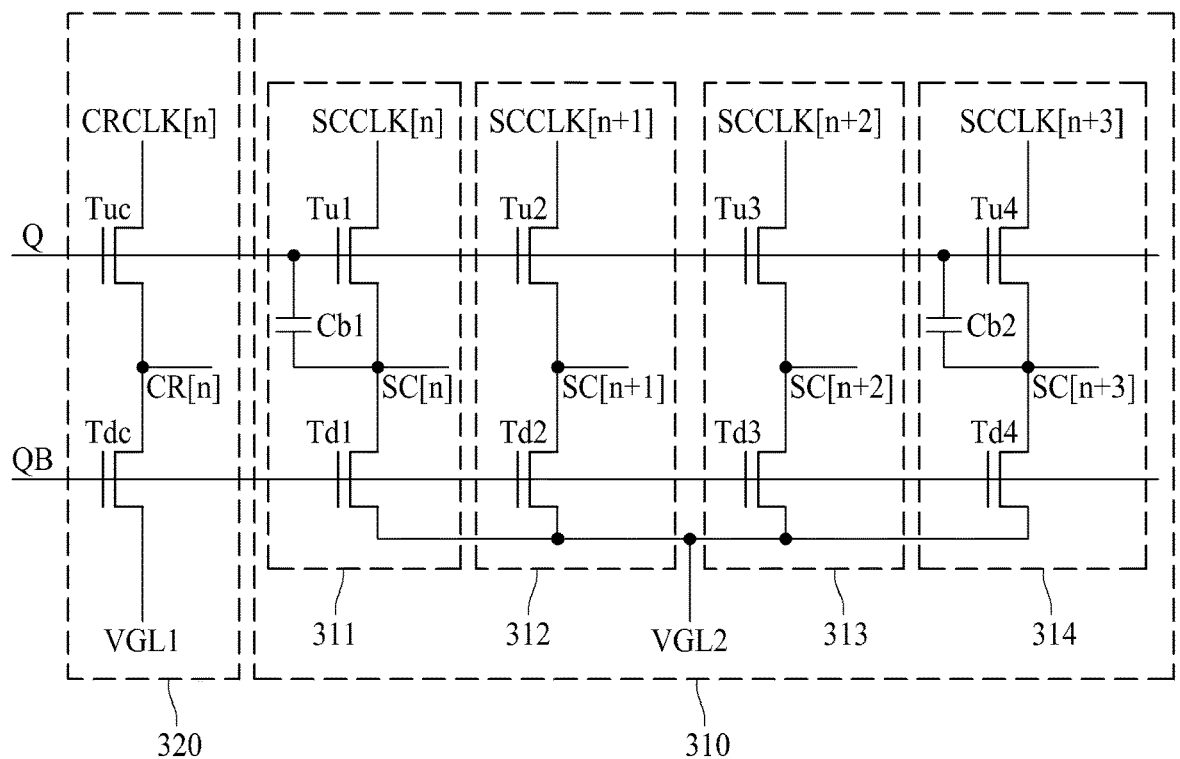
FIG. 15 is a circuit diagram of an output circuit unit according to the fifth embodiment of the present disclosure.
Figure 16:
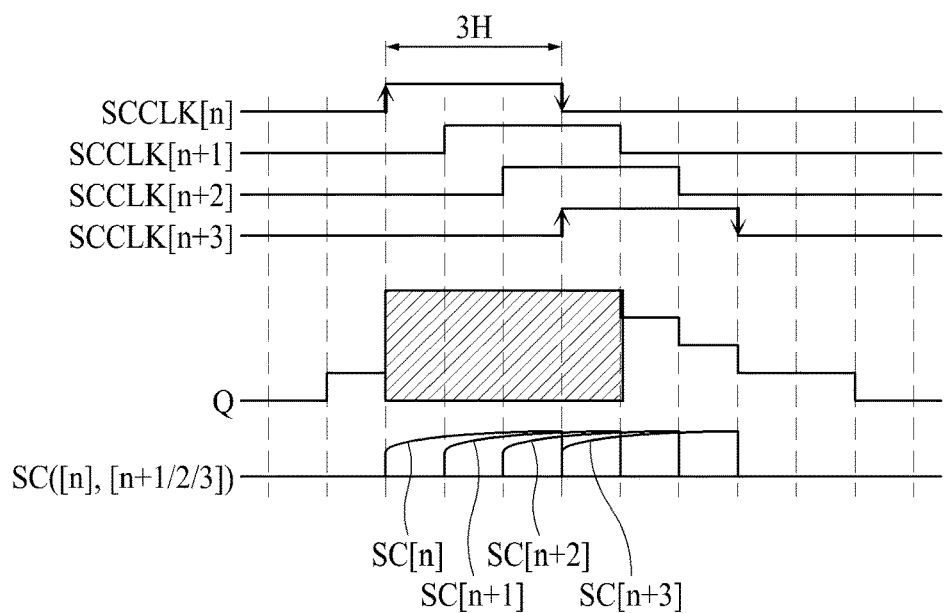
FIG. 16 is a waveform diagram showing a scan clock signal applied to the output circuit unit shown in FIG. 15, a scan signal output from the output circuit unit shown in FIG. 15, and a first node.

FIG. 15 is a circuit diagram of an output circuit unit according to the fifth embodiment of the present disclosure, and FIG. 16 is a waveform diagram showing a scan clock signal applied to the output circuit unit shown in FIG. 15, a scan signal output from the output circuit unit shown in FIG. 15, and a first node. In the description of the third embodiment, a description of the same configuration as those of the first and second embodiments will be omitted.

Referring to FIGS. 15 and 16, the output circuit unit 300 according to the fifth embodiment of the present disclosure implements a scan output circuit unit 310 to output four scan signals. Also, a pulse period of each of the scan clock signals may be maintained for three horizontal periods 3H. For example, when the pixel PX of the display panel 110 has four subpixels, the output circuit unit 300 according to the fifth embodiment of the present disclosure may drive each subpixel by sequentially supplying the four scan signals to the corresponding gate lines GL by each subpixel. Alternatively, the output circuit unit 300 according to the fifth embodiment of the present disclosure may drive the pixels PX corresponding to the four horizontal lines by sequentially supplying the four scan signals to the gate lines GL corresponding to the four horizontal lines of the display panel 110. However, the output circuit unit 300 according to the present disclosure is not limited to outputting only the scan signal, and may be implemented to provide a sense signal SENSE or an emission signal EM.

The scan output circuit unit 310 according to the fifth embodiment of the present disclosure may include first to fourth scan signal output buffers 311, 312, 313, and 314 for outputting the (n)th scan clock signals SCCLK[n] to the (n+3)th scan clock signals SCCLK[n+3] among the plurality of scan clock signals SCCLKs as the (n)th scan signal SC[n] to the (n+3)th scan signal SC[n+3], respectively.

The first scan signal output buffer 311 may include a first scan pull-up transistor Tu1, a first scan pull-down transistor Td1, and a first boosting capacitor Cb1, and the second scan signal output buffer 312 may include a second scan pull-up transistor Tu2 and a second scan pull-down transistor Td2, the third scan signal output buffer 313 may include a third scan pull-up transistor Tu3 and a third scan pull-down transistor Td3, and the fourth scan signal output buffer 314 may include a fourth scan pull-up transistor Tu4, a fourth scan pull-down transistor Td4 and a second boosting capacitor Cb2.

The first to fourth scan pull-up transistors Tu1, Tu2, Tu3, and Tu4 and the first to fourth scan pull-down transistors Td1, Td2, Td3, and Td4 may be connected in series between a terminal to which the scan clock signals SCCLK[n] to SCCLK [n+3] are applied, and a terminal to which the second gate low voltage VGL2 is applied in common. The first boosting capacitor Cb1 may be connected between the gate electrode of the first scan pull-up transistor Tu1 and an output node between the first scan pull-up transistor Tu1 and the first scan pull-down transistor Td1, and the second boosting capacitor Cb2 may be connected between the gate electrode of the fourth scan pull-up transistor Tu4 and an output node between the fourth scan pull-up transistor Tu4 and the fourth scan pull-down transistor Td4. The first boosting capacitor Cb1 may have a larger capacitance than the second boosting capacitor Cb2.

Referring to FIG. 16, the (n)th scan clock signal SCCLK[n] to the (n+3)th scan clock signal SCCLK[n+3] applied to the scan output circuit unit 310 according to the fifth embodiment of the present disclosure may include a pulse period which swings between a first voltage level (or gate high voltage) and a second voltage level (or gate low voltage) and is maintained at the first voltage level for a predetermined or selected horizontal period. For example, the pulse period of each of the (n)th scan clock signal SCCLK[n] to the (n+3)th scan clock signal SCCLK[n+3] may be maintained for the three horizontal periods 3H, and the rising time and the falling time point of each pulse period may be different from each other. Each of the (n)th scan clock signal SCCLK[n] to the (n+3)th scan clock signal SCCLK[n+3] may be sequentially shifted by a predetermined or selected period and have the first voltage level for the three horizontal periods 3H, and the adjacent scan clock signals may overlap each other for a period shorter than the three horizontal periods 3H. For example, the adjacent scan clock signals may overlap each other during two horizontal periods 2H. In addition, the rising time point of any one scan clock signal of the (n)th scan clock signal SCCLK[n] to the (n+3)th scan clock signal SCCLK[n+3] may coincide with the falling time of another scan clock signal. For example, the falling time point of the (n)th scan clock signal SCCLK[n] may coincide with the rising time of the (n+3)th scan clock signal SCCLK[n+3].

Referring to FIGS. 15 and 16, in the scan output circuit unit 310 according to the fifth embodiment of the present disclosure, the first scan signal output buffer 311 may output the (n)th scan clock signal SCCLK[n] firstly applied from the (n)th scan clock signal SCCLK[n] to the (n+3)th scan clock signal SCCLK[n+3] as the (n)th scan signal SC[n] through the scan output node. In the first scan signal output buffer 311, the first boosting capacitor Cb1 may be disposed between the gate electrode of the first scan pull-up transistor Tu1 and the scan output node. The first scan signal output buffer 311 may be represented as a boosting scan signal output buffer for boosting the voltage of the first node Q by the first boosting capacitor Cb1.

The first scan pull-up transistor Tu1 of the first scan signal output buffer 311 may include a gate electrode connected to the first node Q, a first source/drain electrode connected to the scan output node, and a second source/drain electrode connected to a terminal of the (n)th scan clock signal SCCLK[n] firstly applied. The first scan pull-up transistor Tu1 may be represented as a boosting scan pull-up transistor which is switched according to the voltage of the first node Q to output the (n)th scan clock signal SCCLK[n] as the (n)th scan signal SC[n] having the first voltage level through the scan output node.

The first scan pull-down transistor Td1 of the first scan signal output buffer 311 may include a gate electrode connected to the second node QB, a first source/drain electrode connected to the scan output node, and a second source/drain electrode connected to a terminal to which the second gate low voltage VGL2 is applied. The first scan pull-down transistor Td1 may be represented by a boosting scan pull-down transistor which is switched according to the voltage of the second node QB and outputs the second gate low voltage VGL2 as the (n)th scan signal SC[n] having the second voltage level through the scan output node.

The first boosting capacitor Cb1 of the first scan signal output buffer 311 may be implemented between the first node Q and the scan output node. The first boosting capacitor Cb1 may generate the bootstrapping in the first node Q according to the phase transition (or rising of the pulse period) of the (n)th scan clock signal SCCLK[n] firstly applied. Since the first boosting capacitor Cb1 is not affected by the carry clock signal CRCLK[n], the boosting voltage of the first node Q may be increased. The first boosting capacitor Cb1 may be set to have sufficient capacitance to increase the bootstrapping time of the first node Q in order to improve the rising time of the (n)th scan signal SC[n] which is firstly output from the scan output circuit unit 310.

The second scan signal output buffer 312 may output the (n+1)th scan clock signal SCCLK[n+1] as the (n+1)th scan signal SC[n+1] through the scan output node. The second scan signal output buffer 312 may be represented as a normal scan signal output buffer in which the capacitor is not disposed.

The second scan pull-up transistor Tu2 of the second scan signal output buffer 312 may include a gate electrode connected to the first node Q, a first source/drain electrode connected to the scan output node, and a second source/drain electrode connected to a terminal of the (n+1)th scan clock signal SCCLK[n+1]. The second scan pull-up transistor Tu2 may be represented as a normal scan pull-up transistor which is switched according to the voltage of the first node Q boosted by the first boosting capacitor Cb1 to output the (n+1)th scan clock signal SCCLK[n+1] as the (n+1)th scan signal SC[n+1] having the first voltage level through the scan output node. At this time, since the (n+1)th scan clock signal SCCLK[n+1] overlaps the (n)th scan clock signal SCCLK[n] corresponding to the previous signal for one horizontal period 1H, the rising time of the pulse period does not coincide with the falling time of the other scan clock signal. Accordingly, the second scan signal output buffer 312 is not affected by the (n)th scan clock signal SCCLK[n], that is, the reinforcement or offsetting is not generated, whereby the boosting voltage is maintained by the first boosting capacitor Cb1.

The second scan pull-down transistor Td2 of the second scan signal output buffer 312 may include a gate electrode connected to the second node QB, a first source/drain electrode connected to the scan output node, and a second source/drain electrode connected to a terminal to which the second gate low voltage VGL2 is applied. The second scan pull-down transistor Td2 may be represented as a normal scan pull-down transistor which is switched according to the voltage of the second node QB and outputs the second gate low voltage VGL2 as the (n+1)th scan signal SC[n+1] having the second voltage level through the scan output node.

The third scan signal output buffer 313 may output the (n+2)th scan clock signal SCCLK[n+2] as the (n+2)th scan signal SC[n+2] through the scan output node. The third scan signal output buffer 313 may be represented as a normal scan signal output buffer in which the capacitor is not disposed.

The third scan pull-up transistor Tu3 of the third scan signal output buffer 313 may include a gate electrode connected to the first node Q, a first source/drain electrode connected to the scan output node, and a second source/drain electrode connected to a terminal of the (n+2)th scan clock signal SCCLK[n+2]. The third scan pull-up transistor Tu3 may be represented as a normal scan pull-up transistor which is switched according to the voltage of the first node Q boosted by the first boosting capacitor Cb1 to output the (n+2)th scan clock signal SCCLK[n+2] as the (n+2)th scan signal SC[n+2] having the first voltage level through the scan output node. At this time, since the (n+2)th scan clock signal SCCLK[n+2] overlaps the (n)th scan clock signal SCCLK[n] corresponding to the previous signal for one horizontal period 1H, and overlaps the (n+1)th scan clock signal SCCLK[n+1] for two horizontal periods 2H, the rising time of the pulse period does not coincide with the falling time of the other scan clock signal. Accordingly, the third scan signal output buffer 313 is not affected by the (n)th scan clock signal SCCLK[n] and the (n+1)th scan clock signal SCCLK[n+1], that is, the reinforcement or offsetting is not generated, whereby the boosting voltage is maintained by the first boosting capacitor Cb1.

The third scan pull-down transistor Td3 of the third scan signal output buffer 313 may include a gate electrode connected to the second node QB, a first source/drain electrode connected to the scan output node, and a second source/drain electrode connected to a terminal to which the second gate low voltage VGL2 is applied. The third scan pull-down transistor Td3 may be represented as a normal scan pull-down transistor which is switched according to the voltage of the second node QB and outputs the second gate low voltage VGL2 as the (n+2)th scan signal SC[n+2] having the second voltage level through the scan output node.

The fourth scan signal output buffer 314 may output the (n+3)th scan clock signal SCCLK[n+3] as the (n+3)th scan signal SC[n+3] through the scan output node. At this time, the (n+3)th scan clock signal SCCLK[n+3] may rise to coincide with the falling time point of the (n)th scan clock signal SCCLK[n] corresponding to the previous signal. In case of the fourth scan signal output buffer 314, the second boosting capacitor Cb2 may be disposed between the gate electrode of the fourth scan pull-up transistor Tu4 and the scan output node. The fourth scan signal output buffer 314 may be represented as a boosting scan signal output buffer for boosting the voltage of the first node Q by the second boosting capacitor Cb2.

The fourth scan pull-up transistor Tu4 of the fourth scan signal output buffer 314 may include a gate electrode connected to the first node Q, a first source/drain electrode connected to the scan output node, and a second source/drain electrode connected to a terminal of the (n+3)th scan clock signal SCCLK[n+3]. The fourth scan pull-up transistor Tu4 may be represented as a boosting scan pull-up transistor which is switched according to the voltage of the first node Q to output the (n+3)th scan clock signal SCCLK[n+3] as the (n+3)th scan signal SC[n+3] having the first voltage level through the scan output node.

The fourth scan pull-down transistor Td4 of the fourth scan signal output buffer 314 may include a gate electrode connected to the second node QB, a first source/drain electrode connected to the scan output node, and a second source/drain electrode connected to a terminal to which the second gate low voltage VGL2 is applied. The fourth scan pull-down transistor Td4 may be represented as a boosting scan pull-down transistor which is switched according to the voltage of the second node QB and outputs the second gate low voltage VGL2 as the (n+3)th scan signal SC[n+3] having the second voltage level through the scan output node.

The second boosting capacitor Cb2 of the fourth scan signal output buffer 314 may be implemented between the first node Q and the scan output node. The second boosting capacitor Cb2 may generate the bootstrapping in the first node Q according to the phase transition (or rising of pulse period) of the (n+3)th scan clock signal SCCLK [n+3]. According as the (n+3)th scan clock signal SCCLK[n+3] may rise to coincide with the falling time of the (n)th scan clock signal SCCLK[n] corresponding to the previous signal, and may be influenced to be offset, the second boosting capacitor Cb2 may boost the voltage of the first node Q so as to prevent the output deviation of the (n+3)th scan signal SC[n+3]. The second boosting capacitor Cb2 may be set to have the capacitance smaller than that of the first boosting capacitor Cb1, if the second boosting capacitor Cb2 may only generate a bootstrapping level sufficient to maintain the boosting voltage of the first node Q.

Figure 17:
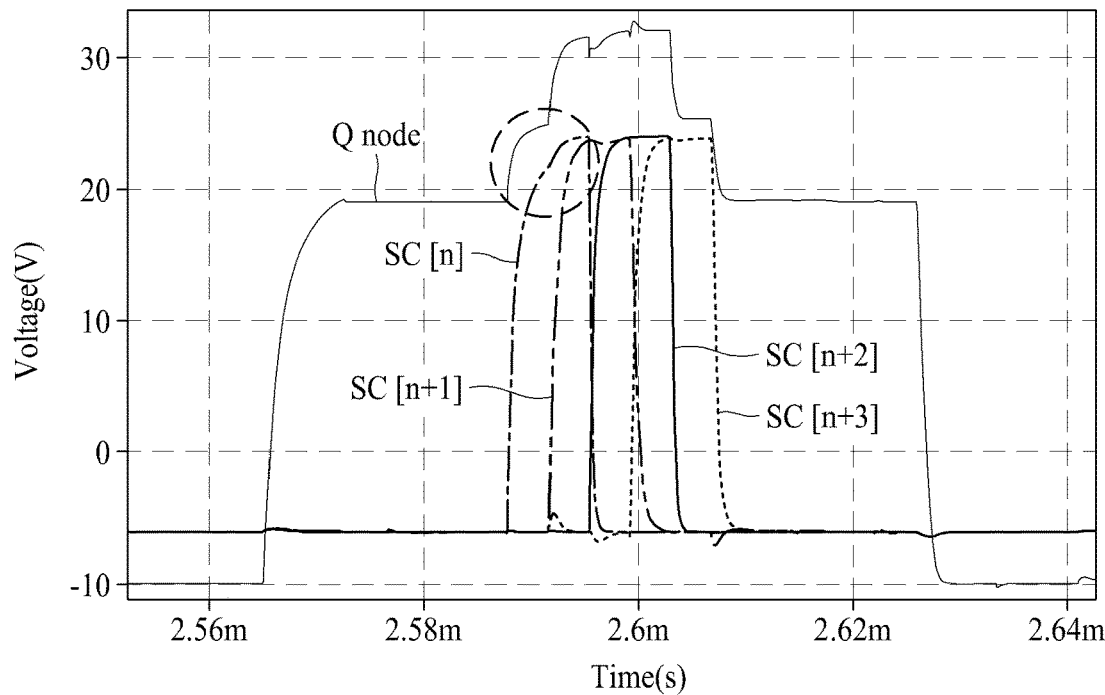
FIGS. 17 and 18 are diagrams illustrating output waveforms of the scan signal and first node according to one example and the first embodiment of the disclosure.
Figure 18:
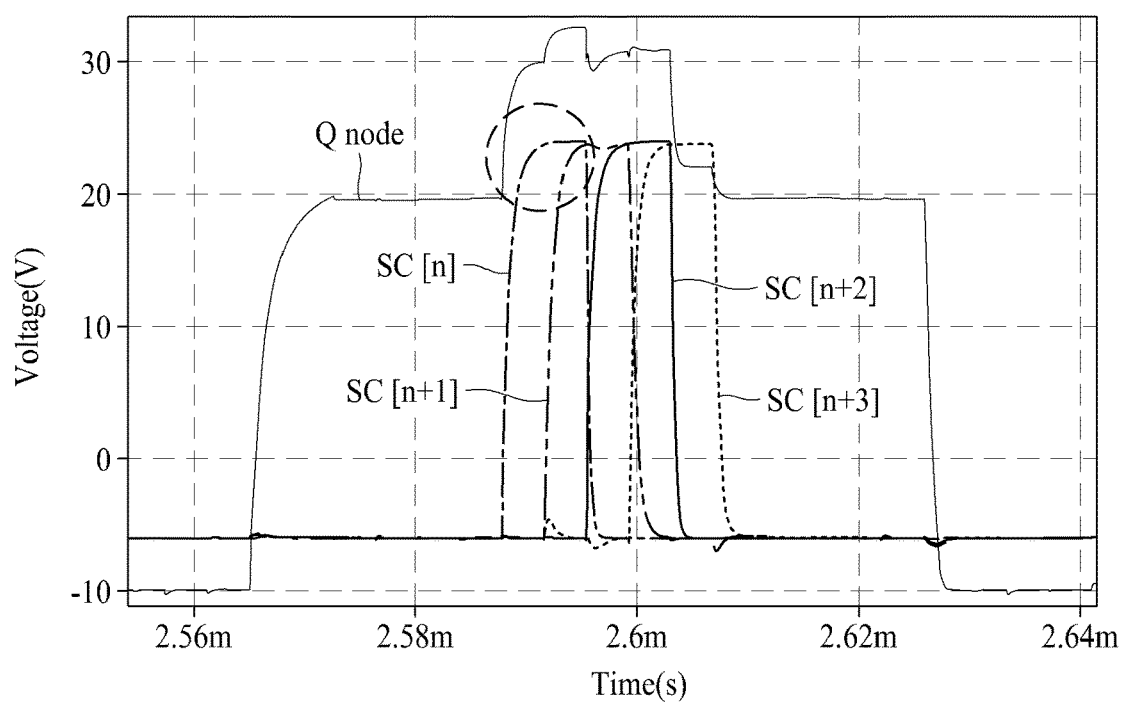

FIGS. 17 and 18 are diagrams illustrating output waveforms of the scan signal and first node according to one example and the first embodiment of the disclosure.

Referring to FIG. 17, one example of the present disclosure uses a method of arranging the capacitor having the same capacitance for each scan signal output buffer of the scan output circuit unit 310. Accordingly, in case of one example, it is possible to confirm that the voltage of the first node Q is low at the timing of the (n)th scan signal SC[n] which is output firstly. In particular, due to the low voltage of the first node Q according to one example, it may be confirmed that the (n)th scan signal SC[n] output firstly has the output deviation with the (n+1)th to (n+2)th scan signals SC[n+1] to SC[n+2] output after the output of the (n)th scan signal SC[n]. In addition, due to the output deviation of the (n)th scan signal SC[n], the rising time of the (n)th scan signal SC[n] is 3.09 µs, which is relatively longer than the rising time of the other scan signal.

Referring to FIG. 18, in the scan output circuit unit 310 according to the first embodiment of the present disclosure, the boosting capacitors Cb1 and Cb2 are respectively disposed only in the first scan signal output buffer 311 for firstly outputting the (n)th scan signal SC[n] and the third scan signal output buffer 313 affected by the (n)th scan clock signal SCCLK[n] applied to the first scan signal output buffer 311. According as the voltage of the first node Q is sufficiently boosted at the timing that the scan output circuit unit 310 firstly outputs the (n)th scan signal SC[n], the output deviation between the (n)th scan signal SC[n] and the (n+1)th to (n+2)th scan signals SC[n+1] to SC[n+2] is not generated. Also, it can be seen that the rising time of the (n)th scan signal SC[n] is 1.57 µs, which becomes significantly faster.

Therefore, according to the first embodiment of the present disclosure, when the plurality of scan signals are sequentially output from one stage circuit, it is possible to prevent the output deviation between the plurality of scan signals.

The gate driving circuit according to the embodiments of the present disclosure and the display device comprising the same may be described as follows.

The gate driving circuit according to an embodiment of the present disclosure, may include a plurality of stage circuits dependently connected to each other and configured to output T output signals ('j' is an integer of 2 or more), wherein each of the plurality of stage circuits includes a logic controller for controlling a voltage of each of first and second nodes, and an output circuit unit for outputting each of 'j' clock signals as the 'j' output signal in response to the voltage of the first node, wherein the output circuit unit includes 'j' output buffers for outputting each of the 'j' clock signals as the 'j' output signal through an output node in response to the voltage of the first node, and a capacitor prepared between the first node and the output node of some of the 'j' output buffers.

In the gate driving circuit according to an embodiment of the present disclosure, the capacitor may be disposed in the first output buffer, which firstly outputs the output signal, among the 'j' output buffers.

In the gate driving circuit according to an embodiment of the present disclosure, each of the 'j' output buffers may be applied with any one clock signal of the 'j' clock signals, and each of the 'j' clock signals may include a pulse period which swings between a first voltage level and a second voltage level different from the first voltage level, and is maintained at the first voltage level for a predetermined or selected horizontal period.

In the gate driving circuit according to an embodiment of the present disclosure, a rising time point and a falling time point of the pulse period may be different in each of the 'j' clock signals.

In the gate driving circuit according to an embodiment of the present disclosure, the rising time point of any one clock signal of the 'j' clock signals may coincide with the falling time point of another scan clock signal.

In the gate driving circuit according to an embodiment of the present disclosure, the capacitor may include a first capacitor disposed in the first output buffer for firstly outputting the output signal among the 'j' output buffers, and a second capacitor disposed in the (g)th output buffer applied with the (g)th clock signal ('g' is an integer of 2 to 'j') which rises to coincide with the falling time point of the clock signal applied to the first output buffer of the 'j' output buffers.

In the gate driving circuit according to an embodiment of the present disclosure, the first capacitor may have a capacitance larger than that of the second capacitor.

In the gate driving circuit according to an embodiment of the present disclosure, the capacitor may include a third capacitor disposed in the (h)th output buffer applied with the (h)th clock signal (if is an integer of 'g+1' to 'j') which rises to coincide with the falling time point of the clock signal applied to the (g)th output buffer of the 'j' output buffers.

In the gate driving circuit according to an embodiment of the present disclosure, the second and third capacitors may have the same capacitance as or different capacitances from each other.

In the gate driving circuit according to an embodiment of the present disclosure, the first capacitor may have a capacitance which is equal to or less than the capacitance sum of the second and third capacitors.

In the gate driving circuit according to an embodiment of the present disclosure, the 'j' clock signals may include the first to (j)th scan clock signals, each of the first to (j)th scan clock signals is sequentially shifted, each scan clock signal has the first voltage level for a first period, and the adjacent scan clock signals overlap each other for a second period shorter than the first period, and the output circuit unit may include the first to (j)th scan signal output buffers respectively applied with the first to (j)th scan clock signals.

In the gate driving circuit according to an embodiment of the present disclosure, the first scan signal output buffer of the first to (j)th scan signal output buffers may output the first scan clock signal of the T scan clock signals as the first scan signal, and the first capacitor is disposed between the first node and the output node of the first scan signal.

In the gate driving circuit according to an embodiment of the present disclosure, the falling time point of the first scan clock signal may coincide with the rising time point of any one scan clock signal of the 'j' scan clock signals.

In the gate driving circuit according to an embodiment of the present disclosure, a second capacitor whose capacitance is smaller than that of the first capacitor may be disposed in the (g)th scan signal output buffer applied with the (g)th scan clock signal which rises to coincide with the falling time point of the first scan clock signal.

In the gate driving circuit according to an embodiment of the present disclosure, a third capacitor whose capacitance is smaller than that of the first capacitor and is the same as or different from that of the second capacitor may be disposed in the (h)th scan signal output buffer applied with the (h)th scan clock signal which rises to coincide with the falling time point of the (g)th scan clock signal.

In the gate driving circuit according to an embodiment of the present disclosure, a boosting scan signal output buffer including the capacitor among the first to (j)th scan signal output buffers may include a boosting scan pull-up transistor which is applied with any one scan clock signal of the first scan clock signal, the (g)th scan clock signal, and the (h)th scan clock signal among the 'j' scan clock signals, and switched by the voltage of the first node, and outputs the applied scan clock signal as the scan signal through a scan output node, a boosting scan pull-down transistor which is switched by the voltage of the second node and outputs a gate low potential voltage through the scan output node, and the capacitor between the scan output node and the first node.

In the gate driving circuit according to an embodiment of the present disclosure, a normal scan signal output buffer, in which the capacitor is not included, among the first to (j)th scan signal output buffers may include a normal scan pull-up transistor which is applied with another scan clock signal except the first scan clock signal, the (g)th scan clock signal, and the (h)th scan clock signal among the T scan clock signals, and switched by the voltage of the first node, and outputs the applied scan clock signal through a scan output node, and a normal scan pull-down transistor which is switched by the voltage of the second node and outputs a gate low potential voltage through the scan output node.

In the gate driving circuit according to an embodiment of the present disclosure, the output circuit unit may further include a carry signal output buffer which is applied with at least one carry clock signal, and outputs the at least one carry clock signal as a carry signal through a carry output node in response to the voltage of the first node.

In the gate driving circuit according to an embodiment of the present disclosure, the carry signal output buffer may include a carry pull-up transistor which is switched by the voltage of the first node, and outputs the carry clock signal as the carry signal through the carry output node, and a carry pull-down transistor which is switched by the voltage of the second node, and outputs a gate low potential voltage through the carry output node.

The display device according to an embodiment of the present disclosure, may include a display panel including a plurality of data lines, a plurality of gate lines crossing the plurality of data lines, and a plurality of subpixels connected to the adjacent data and gate lines, a gate driving circuit unit including a plurality of stage circuits for outputting a scan signal corresponding to a predetermined or selected order by each unit of 'j' gate lines among the plurality of gate lines, a data driving circuit unit connected to each of the plurality of data lines, and a timing control unit for controlling the driving timing of each of the gate driving circuit unit and the data driving circuit unit, wherein the gate driving circuit unit includes the gate driving circuit.

The gate driving circuit according to the present disclosure and the display device comprising the same may reduce the output deviation in the plurality of scan signals output from one stage, and may reduce the size of the device, thereby realizing the narrow bezel and overcoming the luminance deviation.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A gate driving circuit comprising:
a plurality of stage circuits dependently connected to each other, each of the plurality of stage circuits being configured to output 'j' output signals, 'j' being an integer greater than or equal to 2,
wherein each of the plurality of stage circuits includes:
a logic controller for controlling a first voltage of a first node and a second voltage of a second node; and
an output circuit for outputting each of 'j' clock signals as a respective output signal of the 'j' output signals in response to the first voltage of the first node,
wherein the output circuit includes:
'j' output buffers, each of the 'j' output buffers being for outputting a respective clock signal of the 'j' clock signals as one of the 'j' output signals through a respective output node in response to the first voltage of the first node; and
a plurality of capacitors connected between the first node and the respective output node of some of the 'j' output buffers,
wherein the 'j' clock signals include first to (j)th scan clock signals,
the first to (j)th scan clock signals are sequentially shifted, each scan clock signal of the first to (j)th scan clock signals has the first voltage level for a first period, and adjacent scan clock signals of the first to (j)th scan clock signals overlap each other for a second period shorter than the first period, and
the 'j' output buffers include first to (j)th scan signal output buffers respectively applied with the first to (j)th scan clock signals.

2. The gate driving circuit according to claim 1, wherein a first capacitor of the plurality of capacitors is disposed in a first output buffer, which is first to output an output signal of the 'j' output signals, among the 'j' output buffers.

3. The gate driving circuit according to claim 1,
wherein each of the 'j' output buffers is applied with at least one clock signal of the 'j' clock signals, and
each of the 'j' clock signals includes a pulse period which swings between a first clock voltage level and a second clock voltage level different from the first voltage level, and stays at the first clock voltage level for a selected horizontal period.

4. The gate driving circuit according to claim 3, wherein a rising time point and a falling time point of the pulse period are different in each of the 'j' clock signals.

5. The gate driving circuit according to claim 4, wherein the rising time point of at least one clock signal of the 'j' clock signals coincides with the falling time point of another clock signal of the 'j' clock signals.

6. The gate driving circuit according to claim 5,
wherein the plurality of capacitors includes:
a first capacitor disposed in a first output buffer that is first to output an output signal of the 'j' output signals among the 'j' output buffers; and
a second capacitor disposed in a (g)th output buffer of the 'j' output buffers, the (g)th output buffer being applied with a (g)th clock signal of the 'j' clock signals, the (g)th clock signal rising to coincide with the falling time point of a first clock signal of the 'j' clock signals, the first clock signal being applied to the first output buffer of the 'j' output buffers, 'g' being an integer greater than or equal to 2 and less than or equal to 'j'.

7. The gate driving circuit according to claim 6, wherein the first capacitor has a capacitance larger than that of the second capacitor.

8. The gate driving circuit according to claim 6,
wherein the plurality of capacitors includes a third capacitor disposed in an (h)th output buffer of the 'j' output buffers, the (h)th output buffer being applied with an (h)th clock signal of the 'j' clock signals, the (h)th clock signal rising to coincide with the falling time point of the (g)th clock signal applied to the (g)th output buffer of the 'j' output buffers, 'h' being an integer greater than or equal to 'g+1' and less than or equal to 'j'.

9. The gate driving circuit according to claim 8, wherein the second and third capacitors have the same capacitance as or different capacitances from each other.

10. The gate driving circuit according to claim 9, wherein the first capacitor has a capacitance which is equal to or less than a sum of capacitances of the second and third capacitors.

11. The gate driving circuit according to claimer 1, wherein the first scan signal output buffer of the first to (j)th scan signal output buffers outputs the first scan clock signal of the first to (j)th scan clock signals as a first scan signal, and a first capacitor is connected between the first node and a first output node of the first scan signal output buffer.

12. The gate driving circuit according to claim 11, wherein a falling time point of the first scan clock signal coincides with a rising time point of any one scan clock signal of the 'j' scan clock signals.

13. The gate driving circuit according to claim 12, wherein a second capacitor whose capacitance is smaller than that of the first capacitor is disposed in a (g)th scan signal output buffer applied with a (g)th scan clock signal which rises to coincide with the falling time point of the first scan clock signal.

14. The gate driving circuit according to claim 13, wherein a third capacitor whose capacitance is smaller than that of the first capacitor and is the same as or different from that of the second capacitor is disposed in an (h)th scan signal output buffer applied with an (h)th scan clock signal which rises to coincide with a falling time point of the (g)th scan clock signal.

15. The gate driving circuit according to claim 14,
wherein a boosting scan signal output buffer including one of the plurality of capacitors among the first to (j)th scan signal output buffers includes:
a boosting scan pull-up transistor which is applied with any one scan clock signal of the first scan clock signal, the (g)th scan clock signal, and the (h)th scan clock signal among the 'j' scan clock signals, is switched by the first voltage of the first node, and outputs the any one scan clock signal applied as a scan signal through a scan output node;
a boosting scan pull-down transistor which is switched by the second voltage of the second node and outputs a gate low potential voltage through the scan output node; and
the one of the plurality of capacitors connected between the scan output node and the first node.

16. The gate driving circuit according to claim 15,
wherein a normal scan signal output buffer, in which none of the plurality of capacitors is included, among the first to (j)th scan signal output buffers includes:
a normal scan pull-up transistor which is applied with another scan clock signal except the first scan clock signal, the (g)th scan clock signal, and the (h)th scan clock signal among the first to (j)th scan clock signals, is switched by the first voltage of the first node, and outputs the another scan clock signal through a second scan output node; and
a normal scan pull-down transistor which is switched by the second voltage of the second node and outputs a gate low potential voltage through the second scan output node.

17. The gate driving circuit according to claim 1 wherein the output circuit further includes a carry signal output buffer which is applied with at least one carry clock signal, and outputs the at least one carry clock signal as a carry signal through a carry output node in response to the first voltage of the first node.

18. The gate driving circuit according to claim 17,
wherein the carry signal output buffer includes:
a carry pull-up transistor which is switched by the first voltage of the first node, and outputs the carry clock signal as the carry signal through the carry output node; and
a carry pull-down transistor which is switched by the second voltage of the second node, and outputs a gate low potential voltage through the carry output node.

19. A display device comprising:
a display panel including a plurality of data lines, a plurality of gate lines crossing the plurality of data lines, and a plurality of subpixels, each of the plurality of subpixels being connected to a respective adjacent pair of data and gate lines of the plurality of data lines and the plurality of gate lines;
a gate driving circuit;
a data driving circuit connected to each of the plurality of data lines; and
a timing control for controlling driving timing of each of the gate driving circuit and the data driving circuit,
wherein the gate driving circuit includes:
a plurality of stage circuits dependently connected to each other, each of the plurality of stage circuits being configured to output 'j' output signals, 'j' being an integer greater than or equal to 2,
wherein each of the plurality of stage circuits includes:
a logic controller for controlling a first voltage of a first node and a second voltage of a second node; and
an output circuit for outputting each of 'j' clock signals as a respective output signal of the 'j' output signals in response to the first voltage of the first node,
wherein the output circuit includes:
'j' output buffers, each of the 'j' output buffers being for outputting a respective clock signal of the 'j' clock signals as one of the 'j' output signals through a respective output node in response to the first voltage of the first node; and
a plurality of capacitors connected between the first node and the respective output node of some of the 'j' output buffers;
wherein the plurality of stage circuits output a plurality of scan signals by groups of 'j' gate lines among the plurality of gate lines, the outputting being based on a selected order,
wherein the 'j' clock signals include first to (j)th scan clock signals,
the first to (j)th scan clock signals are sequentially shifted, each scan clock signal of the first to (j)th scan clock signals has the first voltage level for a first period, and adjacent scan clock signals of the first to (j)th scan clock signals overlap each other for a second period shorter than the first period, and
the 'j' output buffers include first to (j)th scan signal output buffers respectively applied with the first to (j)th scan clock signals.

20. A display device, comprising:
a display panel including a plurality of subpixels;
a data driver electrically connected to the plurality of subpixels; and
a gate driver electrically connected to the plurality of subpixels, the gate driver including:
a stage circuit that, in operation, outputs a plurality of scan signals, the stage circuit including:
a first output buffer coupled to a first node and a first output node, the first output buffer, in operation, receiving a first clock signal having a first pulse period;
a second output buffer coupled to the first node and a second output node, the second output buffer, in operation, receiving a second clock signal having a second pulse period that lags and overlaps the first pulse period; and
a third output buffer coupled to the first node and a third output node, the third output buffer, in operation, receiving a third clock signal having a third pulse period that lags and overlaps the second pulse period;
wherein first capacitance between the first node and the first output node is greater than third capacitance between the first node and the third output node, and second capacitance between the first node and the second output node is less than the third capacitance.

\* \* \* \* \*